US00RE37199E

(19) United States
(12) Reissued Patent
Yamauchi

(10) Patent Number: US RE37,199 E
(45) Date of Reissued Patent: May 29, 2001

(54) METHOD OF MAKING NONVOLATILE SEMICONDUCTOR MEMORY

(75) Inventor: Yoshimitsu Yamauchi, Nabari (JP)

(73) Assignee: Sharp Kabushiki Kaisha, Osaka (JP)

(21) Appl. No.: 09/340,682

(22) Filed: Jun. 29, 1999

Related U.S. Patent Documents

Reissue of:

(64) Patent No.: 5,877,054
Issued: Mar. 2, 1999
Appl. No.: 08/672,666
Filed: Jun. 28, 1996

(30) Foreign Application Priority Data

Jun. 29, 1995 (JP) ..... 7-163727
Jul. 13, 1995 (JP) ..... 7-177286
Jun. 25, 1996 (JP) ..... 8-164343

(51) Int. Cl.[7] ..... H01L 21/8247
(52) U.S. Cl. ..... 438/264; 438/529
(58) Field of Search ..... 438/257, 264, 438/302, 303, 305, 525, 529, 593, 594, 595

(56) References Cited

U.S. PATENT DOCUMENTS 4,939,690 * 7/1990 Momodomi et al. ..... 365/185.17
4,945,068 * 7/1990 Sugaya ..... 438/264
5,273,923 * 12/1993 Ko-Min et al. ..... 438/264

(List continued on next page.)

FOREIGN PATENT DOCUMENTS

38441154 A1 * 7/1989 (DE) .
0256993A * 2/1988 (EP) .
0364769 A2 * 4/1990 (EP) .

(List continued on next page.)

OTHER PUBLICATIONS

Yoshikawa et al., "An Asymmetrical Lightly Doped Source Cell For Virtual Ground High–Density Eprom's", IEEE Transactions on Electron Devices, vol. 37, No. 4, pp. 1046–1051, XP 000125218, Apr. 1, 1990.*

Ohi et al., "An Asymmetrical Offset Source/Drain Structure For Virtual Ground Array Flash Memory with Dinor Operation", Digest of Technical Papers of the Symposium on VLSI Technology, Kyoto, May 17–19, 1993, No. –, May 17, 1993, Institute of Electrical and.*

Hisamune et al., "A High Capacitive–Coupling Ratio (HiCR) Cell for 3 V–Only 64 Mbit and future Flash Memories", IEDM 93, pp. 19–22, 1993.*

Kato et al., "A 0.4– m Self–Aligned Contactless Memory Cell Technology Suitable for 256–Mbit Flash Memories", IEDM 94, pp. 921–923, 1994.*

*Primary Examiner*—Chandra Chaudhari
(74) *Attorney, Agent, or Firm*—Nixon & Vanderhye P.C.

(57) ABSTRACT

The nonvolatile semiconductor memory of this invention includes: a semiconductor substrate; a plurality of memory cells formed in a matrix on the semiconductor substrate, each of the memory cells including a first insulating film formed on the semiconductor substrate, a floating gate formed on the first insulating film, and a control gate formed on the floating gate via a second insulating film sandwiched therebetween, a source diffusion region, and a drain diffusion region; a diffusion layer formed in a portion of the semiconductor substrate located between two of the memory cells adjacent in a first direction, the diffusion layer including the drain diffusion region for one of the two memory cells and the source diffusion region for the other memory cell; a word line formed by connecting the control gates of the memory cells lined in the first direction; and a bit line formed by connecting the diffusion layers lined in a second direction substantially perpendicular to the first direction, wherein the memory cells have a structure in which a tunnel current flows between the drain diffusion region and the floating gate of one of the two adjacent memory cells via the first insulating film when a predetermined voltage is applied to the diffusion layers and no tunnel current flows between the diffusion layer and the floating gate of the other memory cell.

6 Claims, 33 Drawing Sheets

U.S. PATENT DOCUMENTS

| | | | | |
|---|---|---|---|---|
| 5,283,758 | * | 2/1994 | Nakayama et al. | 365/185.13 |
| 5,379,254 | * | 1/1995 | Chang | 365/185.16 |
| 5,516,713 | * | 5/1996 | Chen-Chiu et al. | 438/264 |
| 5,521,110 | * | 5/1996 | Manzur | 438/263 |
| 5,592,415 | | 1/1997 | Kato et al. | 365/185.29 |
| 5,677,867 | | 10/1997 | Hazani | 365/185.01 |
| 5,745,417 | | 4/1998 | Kobayashi et al. | 365/185.29 |
| 5,747,846 | | 5/1998 | Iida et al. | 257/314 |

FOREIGN PATENT DOCUMENTS

| | | | |
|---|---|---|---|
| 0419663 A1 | * | 4/1991 | (EP) . |
| 0535694 | * | 4/1993 | (EP) . |
| 2073488 | * | 10/1981 | (GB) . |
| 63-099573 | | 4/1988 | (JP) . |
| 2-2685 | * | 1/1990 | (JP) . |
| 2-87578 | * | 3/1990 | (JP) . |
| 02174171 | | 7/1990 | (JP) . |
| 2-2317762 | * | 9/1990 | (JP) . |
| 4-130778 | * | 5/1992 | (JP) . |
| 4-208573 | * | 7/1992 | (JP) . |
| 07094686 | | 4/1995 | (JP) . |
| 7-183407 | * | 7/1995 | (JP) . |
| 07254686 | | 10/1995 | (JP) . |

* cited by examiner

FIG. 40
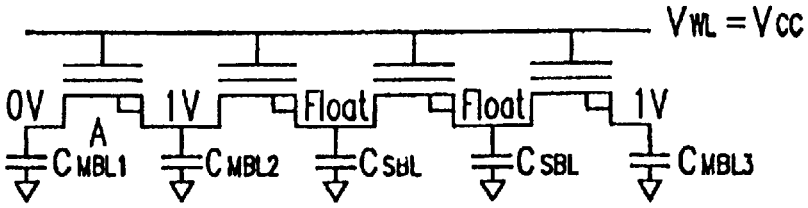
$C_{SBL}/C_{MBL} = 0.1$
$C_{MBL}$: Main Bit Line Capacitance(MBL)
$C_{SBL}$: Sub Bit Line Capacitance(SBL)
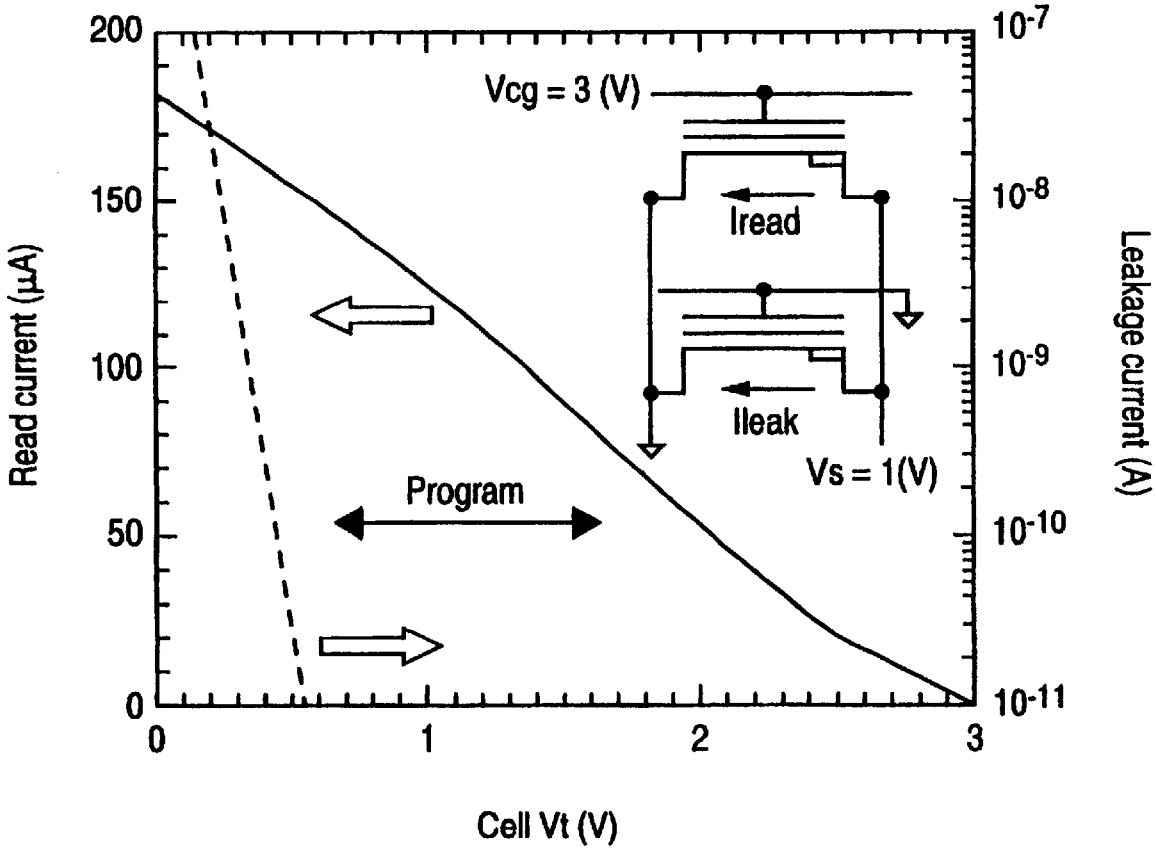
FIG. 41

METHOD OF MAKING NONVOLATILE SEMICONDUCTOR MEMORY

Matter enclosed in heavy brackets [ ] appears in the original patent but forms no part of this reissue specification; matter printed in italics indicates the additions made by reissue.

RELATED APPLICATIONS

This application is related to commonly assigned copending application Ser. No. 08/690,621 filed Jul. 31, 1996.

BACKGROUND OF THE INVENTION

1. Field of the Invention:

The present invention relates to a nonvolatile semiconductor memory using a Fowler-Nordheim (FN) tunnel current for writing and erasing, and a driving method and fabrication method for such a nonvolatile semiconductor memory. More specifically, the present invention relates to a flash memory, and a driving method and fabrication method for the flash memory.

2. Description of the Related Art:

Conventional general flash memories are classified into the type using hot electron injection for writing and the type using an FN tunnel current for writing.

FIG. 47 is a sectional view of memory cells of a conventional flash memory 500 of the type using hot electron injection. FIG. 48 is an equivalent circuit of a memory cell array of the flash memory 500.

Referring to FIG. 47, the flash memory 500 includes a semiconductor substrate 151, a tunnel insulating film 153 formed on the semiconductor substrate 151, and floating gates 155 formed on the tunnel insulating film 153. An insulating film 156 made of ONO($SiO_2$/SiN/$SiO_2$) and the like is formed covering the floating gates 155. Control gates 157 are formed on the insulating film 156. As shown in FIG. 48, memory cells (memory cells $C_{51}$ to $C_{53}$ and $C_{61}$ to $C_{63}$ are shown in FIG. 48) are arranged in a matrix. The control gates 157 of the memory cells lined in an X direction shown in FIG. 47 are electrically connected to one another, forming a word line WL (word lines $WL_1$ and $WL_2$ are shown in FIG. 48).

As shown in FIG. 47, an impurity diffusion layer (a source/drain diffusion layer) 161 is formed between every two memory cells adjacent in the X direction, and shared by the two memory cells as a source diffusion layer 159 for one memory cell and a drain diffusion layer 160 for the other memory cell. Such source/drain diffusion layers are formed in a self-aligning manner by ion implantation using a film as a mask during the fabrication process. Upon completion of the fabrication process, the film will become the floating gates 155 formed in a stripe shape.

As shown in FIG. 48, bit lines BL (bit lines $BL_1$ to $BL_4$ are shown in FIG. 48) extend in the Y direction, electrically connecting the diffusion layers 161 lined in the Y direction with one another. Each bit line serves as a source wiring or a drain wiring depending on the selected memory cell. Such a driving method where each bit line is not fixed as the source wiring or the drain wiring, but where the source wiring (ground line) and the drain wiring are appropriately switched is called a virtual ground method.

In the virtual ground method, since the impurity diffusion layer 161 is used both as the source diffusion layer 159 for one memory cell and the drain diffusion layer 160 for a memory cell adjacent in the X direction as described above, no isolation region is required between the source diffusion layer 159 for one memory cell and the drain diffusion layer 160 for the-adjacent memory cell in the X direction. Furthermore, since the bit lines BL are formed by connecting the impurity diffusion layers 161 lined in the Y direction via diffusion wirings, no contact regions are required for the connection of the bit lines BL with the memory cells. This makes it possible to realize high integration of memories.

Japanese Laid-Open Patent Publication No. 2-231772, for example, discloses the configuration shown in FIG. 51, where two memory cells adjacent in the X direction are paired, sharing a source line SL but having individual bit lines BL. This configuration allows for parallel reading and parallel writing of data.

Referring to FIG. 48, the write operation of a flash memory 500 is conducted in the following manner. Assume that the memory cell $C_{52}$ is selected as a memory cell in which data is to be written (hereinafter, such a selected memory cell is referred to as a selected cell). First, a high voltage is applied to the word line $WL_1$ connected with the selected cell $C_{52}$. Simultaneously, a predetermined voltage is applied to one of the bit lines connected with the selected cell $C_{52}$ (e.g., the bit line $BL_3$) to define the drain side, while a ground voltage (0 V) is applied to the other bit line (e.g., the bit line $BL_2$) to define the source side. As a result, hot electrons generated in a channel region of the selected cell $C_{52}$ are injected into the floating gate 155, allowing data to be written in the memory cell $C_{52}$. At this time, for the other memory cells where no data is written (hereinafter, such memory cells are referred to as non-selected cells), certain voltages are applied to two bit lines connected with any one of the non-selected cells so that the two bit lines have the same potential. For example, for the non-selected cell $C_{51}$, voltages are applied to the bit lines $BL_3$ and $BL_4$ so that the potentials of these bit lines are the same.

The erase operation of the flash memory 500 is conducted in the following manner. A negative voltage is applied to the word lines WL, and simultaneously, a predetermined positive voltage is applied to all the bit lines BL (or all bit lines in a block when the memory cell array is divided into blocks). This causes an FN tunnel current to flow, drawing out charges accumulated in the floating gates 155 and thus erasing data stored in all the memory cells (or all memory cells in the block) at one time.

The read operation of the flash memory 500 is conducted in the following manner. A predetermined voltage is applied to a word line WL connected with a selected cell for reading. Simultaneously, a predetermined voltage is applied to one of two bit lines connected with the selected cell, while a ground voltage (0 V) is applied to the other bit line. The amount of current flowing between the two bit lines is different depending on the amount of charge (i.e., data) stored in the floating gate 155. The data is thus read by detecting the amount of current. At this time, voltages are applied to two bit lines connected with a non-selected cell where no reading is conducted so that the potential of the two bit lines is the same as in the write operation.

The write operation using the channel hot electron injection as described above has the following drawbacks. The efficiency of electron injection (write efficiency) is generally poor. Since the write current is large (about 1 mA), power consumption at writing is large. A high-voltage power source (or a booster) is required to supply the comparatively large write current, which prevents the flash memory 500 from lowering the driving voltage and using a single power source.

In contrast, a flash memory using an FN tunnel current for writing requires a write current of only about several tens of nanoamps (nAs). Therefore, this type of flash memory can use a single power source. FIG. 49 is a sectional view of memory cells of a conventional flash memory 600 of the type using an FN tunnel current for writing. FIG. 50 is an equivalent circuit of a memory cell array of flash memory 600. Similar components to those of flash memory 500 shown in FIGS. 46 and 47 are denoted by the same reference numerals.

Referring to FIG. 49, the flash memory 600 includes a semiconductor substrate 151, a tunnel insulating film 153 formed of a uniform oxide film on the semiconductor substrate 151, and floating gates 155 formed on the tunnel insulating film 153. A source diffusion layer 159 and a drain diffusion layer 160 are formed on both ends of each of the floating gates 155. An element isolation film 162 is formed between every two adjacent memory cells, isolating the source diffusion layer 159 of one memory cell from the drain diffusion layer 160 of the other memory cell. An insulating film 156 made of ONO ($SiO_2/SiN/SiO_2$) is formed covering the floating gates 155. Control gates 157 are formed on the insulating film 156.

Referring to FIG. 50, memory cells (memory cells $C_{71}$ to $C_{73}$ and $C_{81}$ to $C_{83}$ are shown in FIG. 50) are arranged in a matrix. The control gates 157 of the memory cells lined in the X direction shown in FIG. 50 are electrically connected with one another, forming a word line WL (word lines $WL_1$ and $WL_2$ are shown in FIG. 50). Bit lines BL (bit lines $BL_1$ to $BL_6$ are shown in FIG. 50) extend in the Y direction, electrically connecting the corresponding source diffusion layers 159 or the drain diffusion layers 160 with one another. The function of each bit line BL is fixed as the source line or the drain line.

The write operation of the flash memory 600 is conducted in the following manner. A negative voltage or 0 V is applied to the word line WL connected with a selected cell, while a positive voltage is applied to the drain diffusion layer 160 of the connected cell so that electrons are drawn out of the floating gate 155. The erase operation is conducted in the following manner. A positive high voltage is applied to one word line WL, while 0 V is applied to the source diffusion layers 159 and the drain diffusion layers 160 so that electrons are injected into the floating gates of all the memory cells connected with the word line WL.

FIG. 51 shows another example of the flash memory 700 using an FN tunnel current. In the memory cell 600 of FIG. 49, the drain diffusion layer and the source diffusion layer cell of the adjacent memory cells are isolated from each other. In the flash memory 700 of FIG. 51, the drain diffusion layers of respective memory cells are separated from one another and these individual drain diffusion layers lined in the Y direction are connected with one another to form a bit line. Simultaneously, each pair of memory cells adjacent in the X direction share the source diffusion layer to form a source line extending in the Y direction.

However, the conventional flash memory of the type using an FN tunnel current has the following drawbacks. As described above, in the conventional memory using an FN tunnel current for writing, a tunnel current generated by the electric field applied to the tunnel insulating film 153 is used. Accordingly, if in the memory cells shown in FIG. 49, each pair of memory cells adjacent in the X direction share the diffusion layer as shown in FIG. 48, data will be written in a non-selected memory cell which shares the drain diffusion layer with a selected memory cell in data is to be written and is connected with the same word line as the selected memory cell. Accordingly, it is necessary to form the element isolation film 162 as shown in FIG. 49 and isolate at least the drain diffusion layers 160 of the adjacent memory cells in the X direction from each other as shown in FIGS. 50 and 51. Thus, the conventional flash memory of the type using an FN tunnel current for writing cannot employ the virtual ground method. This prevents the flash memory of this type from being made smaller.

As shown in FIG. 49, the tunnel insulating film 153 is comparatively thin. Accordingly, when a comparatively high voltage is applied to the drain diffusion layer 160 at writing, a current $10^6$ times the write current may sometimes flow from the end of the drain diffusion layer 160 to the substrate 151 due to the interband tunnel phenomenon.

As the tunnel insulating film 153 becomes thinner, the capacitance between the floating gate and the substrate is larger. This makes it difficult to increase the capacitance coupling ratio of the control gate. Also, as the tunnel insulating film 153 becomes thinner, the disturb margin against a high voltage to be applied to the control gate electrode at writing becomes smaller.

SUMMARY OF THE INVENTION

The nonvolatile semiconductor memory of this invention includes: a semiconductor substrate; a plurality of memory cells formed in a matrix on the semiconductor substrate, each of the memory cells including a first insulating film formed on the semiconductor substrate, a floating gate formed on the first insulating film, and a control gate formed on the floating gate via a second insulating film sandwiched therebetween, a source diffusion region, and a drain diffusion region; a diffusion layer formed in a portion of the semiconductor substrate located between two of the memory cells adjacent in a first direction, the diffusion layer including the drain diffusion region for one of the two memory cells and the source diffusion region for the other memory cell; a word line formed by connecting the control gates of the memory cells lined in the first direction; and a bit line formed by connecting the diffusion layers lined in a second direction substantially perpendicular to the first direction, wherein the memory cells have a structure in which a tunnel current flows between the drain diffusion region and the floating gate of one of the two adjacent memory cells via the first insulating film when a predetermined voltage is applied to the diffusion layer and no tunnel current flows between the diffusion layer and the floating gate of the other memory cell.

In one embodiment of the invention, the source diffusion region and the drain diffusion region of each of the memory cells have impurity densities different from each other.

In another embodiment of the invention, the drain diffusion region has a double-layered diffusion layer structure where the impurity density is lower in an outer layer.

In still another embodiment of the invention, the first insulating film includes a first portion which does not constitute a tunnel region and a second portion which constitutes a tunnel region, and the drain diffusion region of each memory cell capacitively couples with the floating gate via the second portion, and the source diffusion region of each memory cell capacitively couples with the floating gate via the first portion.

In still another embodiment of the invention, the thickness of the first portion of the first insulating film which does not constitute a tunnel region is larger than that of the second portion which constitutes a tunnel region.

According to another aspect of the invention, a method for fabricating a nonvolatile semiconductor memory is provided. The method includes the steps of: forming a tunnel insulating film on a semiconductor substrate of a first conductivity type; forming a first conductive layer pattern with a patterned portion having a predetermined width by patterning a first conductive layer formed on the semiconductor substrate; forming a first diffusion layer in the semiconductor substrate by implanting impurities of a second conductivity type using the first conductive layer pattern as a mask; forming a second diffusion layer in the semiconductor substrate in contact with the first diffusion layer by implanting impurities of the second conductivity type under implantation conditions different from those for forming the first diffusion layer, the impurity density of the second diffusion layer being higher than that of the first diffusion layer; forming an insulating film and a second conductive layer on the first conductive layer pattern in this order; and patterning the second conductive layer, the insulating film, and the first conductive layer, to form control gates, insulating layers, and floating gates, respectively.

In one embodiment of the invention, the step of forming the second diffusion layer is performed using a mask having a second width, and the impurities of the second conductivity type are implanted in a predetermined region of the first diffusion layer.

In another embodiment of the invention, the step of forming the first diffusion layer includes implanting the impurities of the second conductivity type at a predetermined angle directed to one side of an opening of the first conductive layer pattern used as the mask, and the step of forming the second diffusion layer includes implanting the impurities of the second conductivity type at a predetermined angle directed to the other side of the opening of the first conductive layer pattern used as the mask.

Alternatively, the method for fabricating a nonvolatile semiconductor memory of this invention includes: the steps of: forming a first insulating film on a semiconductor substrate of a first conductivity type; forming a drain diffusion layer by implanting impurities of a second conductivity type in the semiconductor substrate using a first resist pattern having a first opening as a mask, forming a gate insulating film using a second resist pattern having a second opening corresponding to a tunnel region as a mask and removing a portion of the first insulating film located below the second opening; forming a tunnel insulating film in the tunnel region where the first insulating film has been removed by forming a second insulating film on the semiconductor substrate after removal of the second resist pattern; forming a first conductive layer having a predetermined width by patterning to cover the tunnel region where the tunnel insulating film has been formed; forming a source diffusion layer in contact with the drain diffusion layer by implanting impurities of the second conductivity type in the semiconductor substrate using the first conductive layer as a mask; forming a third insulating film; and forming a second conductive layer on the third insulating film by patterning.

Alternatively, the method for fabricating a nonvolatile semiconductor memory of this invention includes the steps of: forming a first insulating film on a semiconductor substrate of a first conductive type; forming a drain diffusion layer by implanting impurities of a second conductivity type in the semiconductor substrate using a resist pattern having an opening corresponding to a tunnel region as a mask; removing a portion of the first insulating film using the resist pattern as a mask; forming a tunnel insulating film in the tunnel region where the first insulating film has been removed by forming a second insulating film on the semiconductor substrate after removal of the resist pattern; forming a first conductive layer having a predetermined width by patterning to cover the tunnel region where the tunnel insulating film has been formed; forming a source diffusion layer in contact with the drain diffusion layer by implanting impurities of the second conductivity type in the semiconductor substrate using the first conductive layer as a mask; forming a third insulating film; and forming a second conductive layer on the third insulating film by patterning.

Alternatively, the method for fabricating a nonvolatile semiconductor memory of this invention includes the steps of: forming a first insulating film on a semiconductor substrate of a first conductivity type; forming a first nitride film having a first width on the first insulating film by patterning; covering the first nitride film with an oxide film and then forming spacers on both side walls of the first nitride film, the spacer on one of the side walls corresponding to a region defining a tunnel region; forming a diffusion layer by implanting impurities of a second conductivity type using the first nitride film and the spacers on the side walls as a mask; removing the spacer on the other side wall of the first nitride film; forming a second insulating film having a thickness larger than that of the first insulating film selectively using the first nitride film and the spacer as a mask; removing the spacer on the one of the both side walls of the first nitride film and a portion of the first insulating film located below the spacer; forming a thermal oxide film in a region where the spacer on the other side wall and the portion of the first insulating film have been removed; removing the first nitride film; removing the thermal oxide film; forming a tunnel region by forming a tunnel insulating film on a region where the thermal oxide film has been removed; and forming a floating gate to cover the tunnel region.

In one embodiment of the invention, writing and erasing are conducted using a tunnel current, the memory including: a plurality of memory cells formed in a matrix on a semiconductor substrate and divided into a plurality of blocks; a word line formed by connecting control gates of the memory cells lined in a first direction; a first bit line formed by connecting diffusion layers formed between the memory cells adjacent in the first direction in a second direction perpendicular to the first direction; a second bit line provided to correspond to a predetermined number of the first bit lines; and a selective transistor provided to correspond to each of the first bit lines for connecting the first bit line to the corresponding second bit line, wherein the selective transistor electrically connects the first bit lines in a selected block to the corresponding second bit lines and puts the first bit lines in blocks other than the selected block in a floating state, in order to conduct an erase operation for every block.

In another embodiment of the invention, the plurality of blocks are formed within one well region of the semiconductor substrate.

A method for driving a nonvolatile semiconductor memory is provided. The memory includes: a plurality of memory cells formed in a matrix on a semiconductor substrate and divided into a plurality of blocks; a word line formed by connecting control gates of the memory cells lined in a first direction; a first bit line formed by connecting diffusion layers formed between the memory cells adjacent in the first direction in a second direction perpendicular to the first direction; a second bit line provided to correspond to a predetermined number of the first bit lines; and a selective transistor provided to correspond to each of the first bit lines for connecting the first bit line to the corresponding second bit line. The method includes the steps of: electrically connecting the first bit lines in a selected block to the corresponding second bit lines, while putting the-first bit lines in blocks other than the selected block in a floating state by controlling the selective transistors; applying a predetermined negative voltage to the first bit lines and the semiconductor substrate; applying a predetermined positive voltage to the word lines in the selected block, while applying a ground voltage to the word lines in the blocks other than the selected block; and consequently erasing data in the memory cells in the selected block using a tunnel current.

Alternatively, a method for driving a nonvolatile semiconductor memory is provided. The memory includes: a plurality of memory cells formed in a matrix on a semiconductor substrate; a word line formed by connecting control gates of the memory cells lined in a first direction; a first bit line formed by connecting diffusion layers formed between the memory cells adjacent in the first direction in a second direction perpendicular to the first direction; a second bit line provided to correspond to a predetermined number (N) of first bit lines; a selective transistor provided to correspond to each of the first bit lines for connecting the first bit line to the corresponding second bit line; and a signal line for controlling the N selective transistors separately. The method includes the steps of: (a) selecting a word line; (b) supplying a predetermined potential to the second bit line connected with a drain of the memory cell in which data is to be written; (c) selecting one of the N first bit lines to be connected to the second bit line by controlling one of the signal lines to allow the corresponding selective transistor to be turned on, and writing data on the selected second bit line in the memory cell connected with the selected word line and the first bit line connected to the second bit line; and (d) repeating step (c) to write data in all the N memory cells connected with the selected word line and the N first bit lines corresponding to the selected second bit.

Alternatively, a method for driving a nonvolatile semiconductor memory is provided. The memory includes: a plurality of memory cells formed in a matrix on a semiconductor substrate and divided into a plurality of blocks; a word line formed by connecting control gates of the memory cells lined in a first direction; a first bit line formed by connecting diffusion layers formed between the memory cells adjacent in the first direction in a second direction perpendicular to the first direction; a second bit line provided to correspond to a predetermined number of the first bit lines; and a selective transistor provided to correspond to each of the first bit lines for connecting the first bit line to the corresponding second bit line selectively. The method includes the steps of: applying a predetermined voltage to the word line connected with the memory cell from which data is to be read; applying a predetermined voltage to one of the first bit lines connected with a source diffusion layer of the memory cell from which data is to be read, and applying the same predetermined voltage to the other first bit lines existing in parallel with the one of the first bit lines via the one of the first bit lines under a floating state.

A method for driving a nonvolatile semiconductor memory is provided. The memory cells of the nonvolatile semiconductor device have a structure in which a tunnel current flows between the drain diffusion region and the floating gate of one of the two adjacent memory cells via the first insulating film when a predetermined voltage is applied to the diffusion layer and no tunnel current flows between the diffusion layer and the floating gate of the other memory cell. The method comprises a step of applying a predetermined voltage to the memory cell from the source diffusion region so as to read data stored in the memory cell.

Thus, according to the present invention, an asymmetric memory cell where the coupling capacitance of the floating gate is asymmetric between the source diffusion region side and the drain diffusion region side at writing is used. Accordingly, when voltages are applied to a word line and bit lines (drain diffusion layers) connected with a selected memory cell (selected cell), no data is written in a non-selected cell of which the source diffusion region is connected with the selected bit line. Such an asymmetric memory cell can be realized by having the impurity density of the drain diffusion layer higher than that of the source diffusion layer. Since the floating gate is capacitively coupled with the high-density drain diffusion layer, a tunnel current easily flows between the floating gate and the drain diffusion layer via the tunnel insulating film. In contrast, the impurity density of the source diffusion layer capacitively coupled with the floating gate is low even if the same voltage as that applied to the drain diffusion layer is applied to the source diffusion layer. The surface of this low-density source diffusion layer is thus depleted, lowering the electric field applied to the tunnel insulating film and thus preventing the tunnel phenomenon from occurring. Thus, in the non-selected cell sharing the bit line with the selected cell, no tunnel current flows since the floating gate thereof is capacitively coupled with the low-density source diffusion layer of the shared bit-line, preventing data from being mistakenly written in the non-selected cell.

The above asymmetric memory cell can also be realized by forming a tunnel insulating film only between the drain diffusion layer and the floating gate. In such a case, when voltages are applied to a word line and bit lines of a selected cell, since the floating gate of the selected cell is coupled with one of the bit lines via a tunnel insulating film with a smaller thickness, tunnel current flows easily. As for the non-selected cell which is connected with the same word line and shares the same bit line, the floating gate is capacitively coupled with the bit line via the gate insulating film with a comparatively large thickness. Thus, no tunnel current is allowed to flow through the thick gate insulating film. Accordingly, it is possible to employ the virtual ground method where one bit line is shared by two adjacent memory cells without writing data mistakenly in a non-selected cell in the write operation using a tunnel current.

Thus, the invention described herein makes possible the advantages of (1) providing a nonvolatile semiconductor memory using an FN tunnel current for writing and erasing and employing the virtual ground method for driving a memory cell array thereof, (2) providing a driving method of such a nonvolatile semiconductor memory, (3) providing a fabrication method of such a nonvolatile semiconductor memory, (4) providing a nonvolatile semiconductor memory with high write efficiency and reliability where a current flowing into a semiconductor substrate at writing is reduced, (5) providing a driving method of such a nonvolatile semiconductor memory, and (6) providing a fabrication method of such a nonvolatile semiconductor memory.

These and other advantages of the present invention will become apparent to those skilled in the art upon reading and understanding the following detailed description with reference to the accompanying figures.

BRIEF DESCRIPTION OF THE DRAWINGS

FIG. 40 shows a state of a memory cell in the read operation.

FIG. 41 shows the relationship between the read current (channel current) and the leak current in the read operation.

DESCRIPTION OF THE PREFERRED EMBODIMENTS

The present invention will be described by way of examples with reference to the accompanied drawings.

(EXAMPLE 1)

Figure 1:
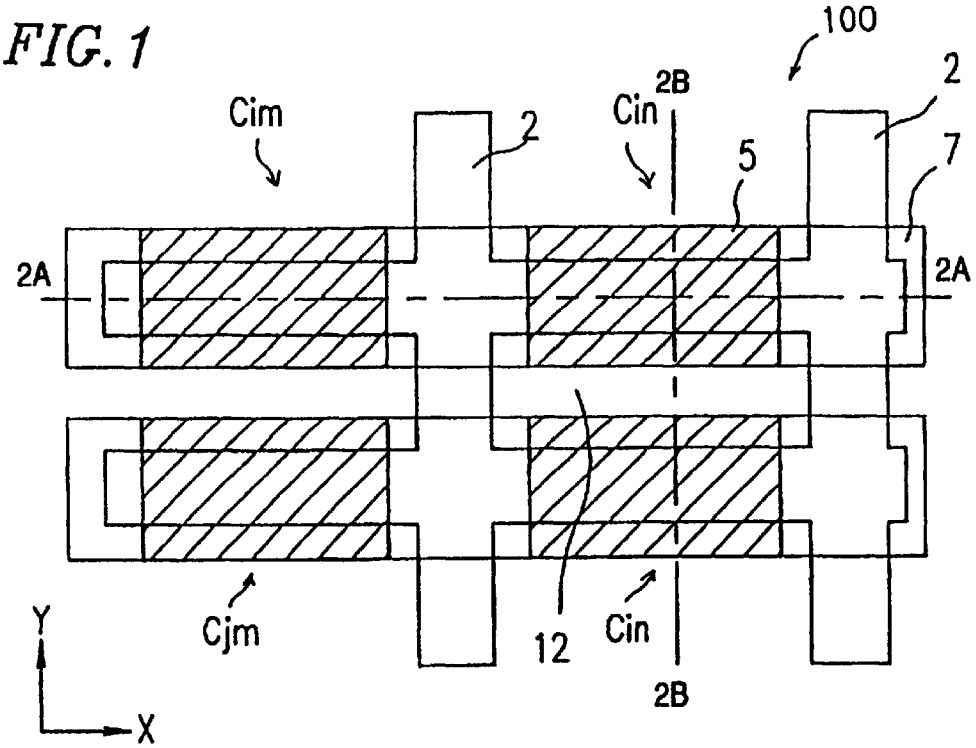
FIG. 1 is a plan view of a portion of a memory cell array of a nonvolatile semiconductor memory of Example 1 according to the present invention.
Figure 2A:
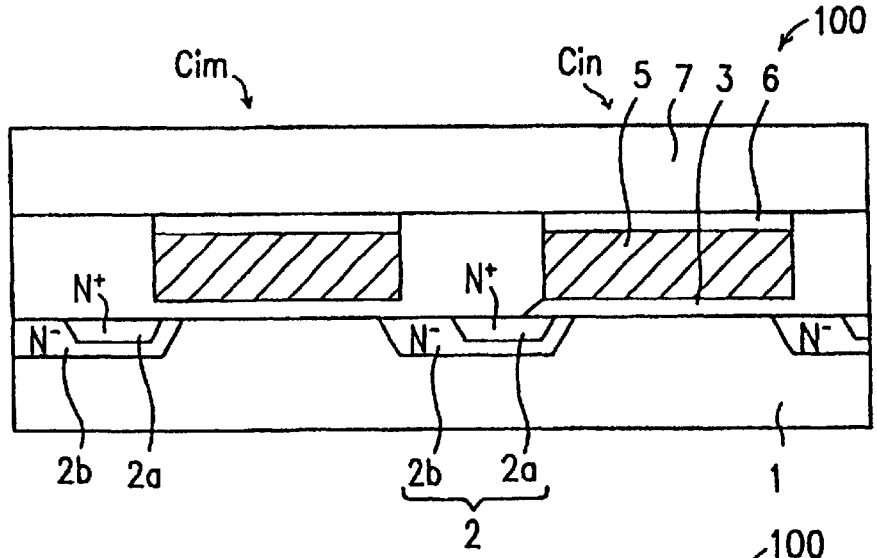
FIGS. 2A and 2B are sectional views of the memory cell array shown in FIG. 1 taken along lines A—A and B—B of FIG. 1, respectively.
Figure 2B:
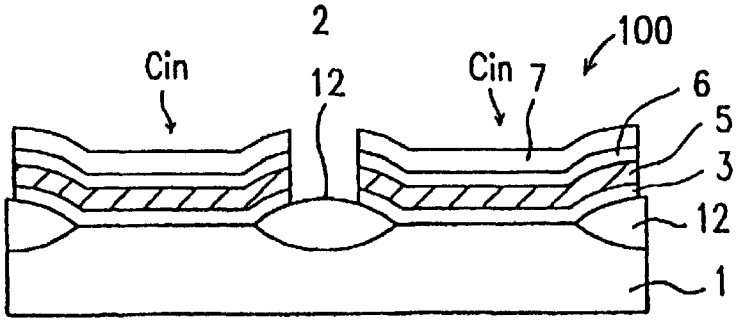

FIG. 1 is a plan view of a portion of a memory cell array of a nonvolatile semiconductor memory 100 of Example 1 according to the present invention. FIGS. 2A and 2B are sectional views of the nonvolatile semiconductor memory 100 taken along lines A—A and B—B of FIG. 1, respectively, Referring to FIGS. 1, 2A, and 2B, the nonvolatile semiconductor memory 100 includes a plurality of memory cells C formed in a matrix on a semiconductor substrate 1. In FIG. 1, the respective memory cells C are denoted by individual codes such as $C_{im}$. Each of the memory cells C includes a tunnel insulating film 3 formed on the semiconductor substrate 1 and a floating gate 5 formed on the tunnel insulating film 3.

Figure 3:
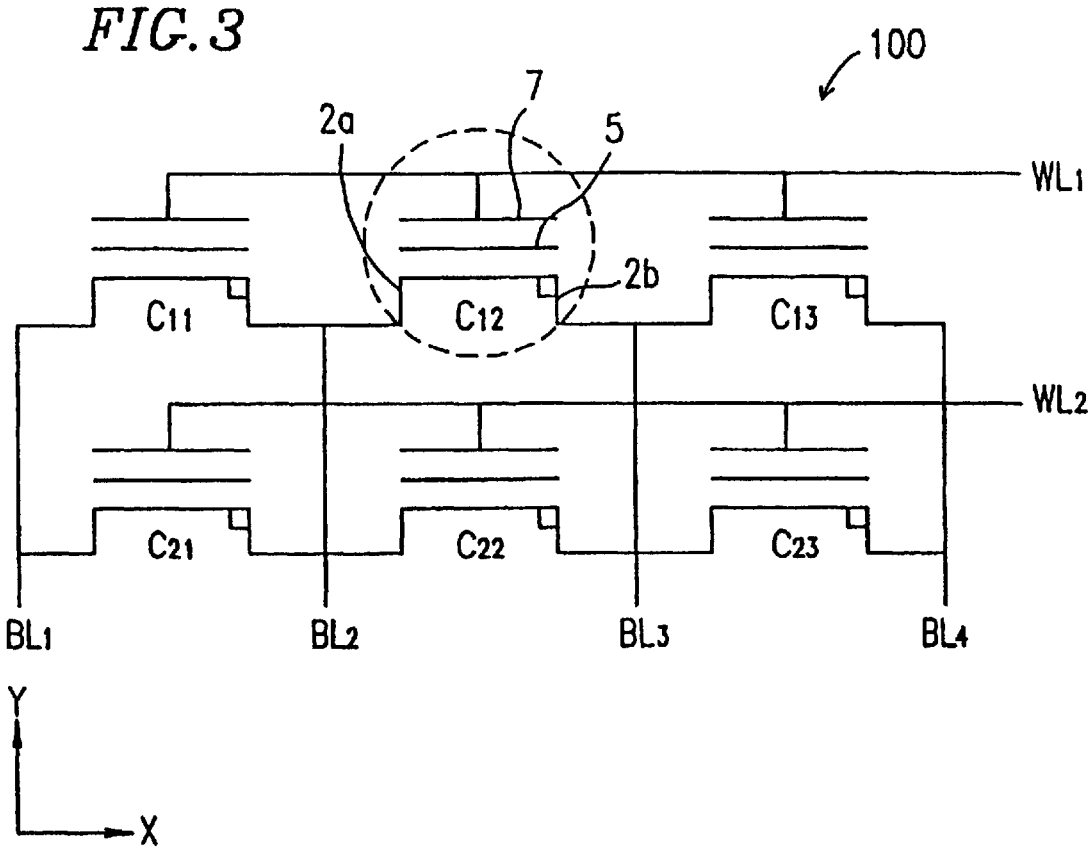
FIG. 3 is an equivalent circuit diagram of the memory cell array of the nonvolatile semiconductor memory of Example 1.

A control gate 7 is formed on the floating gate 5 via an insulating film 6 made of ONO and the like. Such control gates 7 extend in a channel direction of the memory cell C (an X direction shown in FIG. 1), constituting a word line WL as shown in FIG. 3 for connecting the memory cells C lined in the X direction.

As shown in FIGS. 1 and 2A, a diffusion layer 2 is formed-between every two memory cells adjacent each other in the X direction (e.g., memory cells $C_{im}$ and $c_{in}$). The diffusion layer 2 includes a drain diffusion layer 2a for one of the two adjacent memory cells (e.g., the memory cell $C_{im}$) and a source diffusion layer 2b for the other memory cell (e.g., the memory cell $C_{in}$). The diffusion layer 2 is thus shared by the two adjacent memory cells. The impurity density of the drain diffusion layer 2a ($N^+$) is made higher than that of the source diffusion layer 2b ($N^-$). The diffusion layer 2 has a double-layered structure where the drain diffusion layer 2a is formed inside the diffusion region with a low impurity density constituting the source diffusion layer 2b.

In the memory cell C located between the two diffusion layers 2, the floating gate 5 is capacitively coupled with the drain diffusion layer 2a of one of the two diffusion layers 2 via the tunnel insulating film 3 (defining the drain side), while it is capacitively coupled with the source diffusion layer 2b of the other diffusion layer 2 via the tunnel insulating film 3 (defining the source side). The tunnel insulating film 3 may be composed of a silicon oxide film or a lamination of a silicon oxide film and a silicon nitride film.

In this example, the diffusion layers 2 lined in the Y direction are connected with one another via diffusion layer wirings, forming a so-called buried bit line. Alternatively, the diffusion layers 2 may be electrically connected with one another with metal wirings. In the latter case, a contact region is required for each diffusion layer 2. As shown in FIG. 2B, a field oxide film (element isolation film) 12 is formed between two memory cells adjacent in the Y direction (e.g., the memory cells $C_{in}$ and $C_{jn}$).

As shown in the equivalent circuit diagram of FIG. 3, the nonvolatile semiconductor memory 100 employs the virtual ground method, where bit lines BL (bit lines $BL_1$ to $BL_4$ are shown in FIG. 3) serve as source wirings or drain wirings depending on the selected cell.

The operation of the nonvolatile semiconductor memory 100 will now be described. Table 1 below shows the operation conditions when the memory cell $C_{12}$ shown in FIG. 3 is selected, for example.

TABLE 1

| Operation | Word line voltage (V) | | Bit line voltage (V) | | | |
|---|---|---|---|---|---|---|
| | Selected | Non-selected | | | | |
| mode | $WL_1$ | $WL_2$ | $BL_1$ | $BL_2$ | $BL_3$ | $BL_4$ |
| Write | −8 | 0 | Float | 4 | Float | Float |
| Erase | 17 | 0 | 0 | 0 | 0 | 0 |
| Read | 3 | 0 | 0 | 0 | 1 | 1 |

In the write operation, a negative high voltage $V_{H1}$ (e.g., −8 V) is applied to the word line $WL_1$ connected with the control gate 7 of the memory cell $C_{12}$, while 0 V is applied to the other word lines. A predetermined positive voltage $V_{cc}$ (e.g., 4 V) is applied to the bit line $BL_2$ connected with the drain diffusion layer 2a for the memory cell $C_{12}$, while the other bit lines are put in a floating state. In the memory cell $C_{12}$ of the above state, a tunnel current flows from the drain diffusion layer 2a to the floating gate 5 via the tunnel insulating film 3 due to the electric field applied between the floating gate 5 and the drain diffusion layer 2a, allowing data to be written in the memory cell $C_{12}$.

The same write voltage is also applied to the control gate 7 of a non-selected cell which is connected with the selected word line WL and the source diffusion layer 2b of the bit line BL of which source is selected, for example, the non-selected cell $C_{11}$ which is connected with the word line $W_1$ and the bit line $BL_2$. However, since the impurity density of the source diffusion layer 2b is low, no tunnel current flows between the source diffusion layer 2b and the floating gate 5 of the non-selected cell $C_{11}$. Accordingly, even though the diffusion layer 2 is shared with the selected cell, no data is written in the n on-selected cell.

In the erase operation, first, 0 V is applied to all the bit lines BL. Then, a positive high voltage $V_{H2}$ (e.g., 17 V) is applied to a desired word line WL. This allows electrons to be injected into the floating gates 5 of a plurality of memory cells simultaneously, and thus data are erased at one time. For example, when a high voltage $V_{H2}$ is applied to the word line $WL_1$, date in the memory cells $C_{11}$, $C_{12}$, and $C_{13}$ are erased at one time. When a high voltage $V_{H2}$ is applied to the word line $WL_2$, date in the memory cells $C_{21}$, $C_{22}$, and $C_{23}$ are erased at one time.

The data reading from the selected cell $C_{12}$ is conducted in a conventional manner. First, a predetermined voltage $V_{cc}$ (e.g., 3 V) is applied to the word line $WL_1$. Simultaneously, a predetermined voltage $V_L$ (e.g., 1 V) is applied to the bit line $BL_2$, and 0 V is applied to the bit line $BL_3$. A current flows between these bit lines, and data is read by detecting a potential at the bit line $BL_3$.

Figure 4:
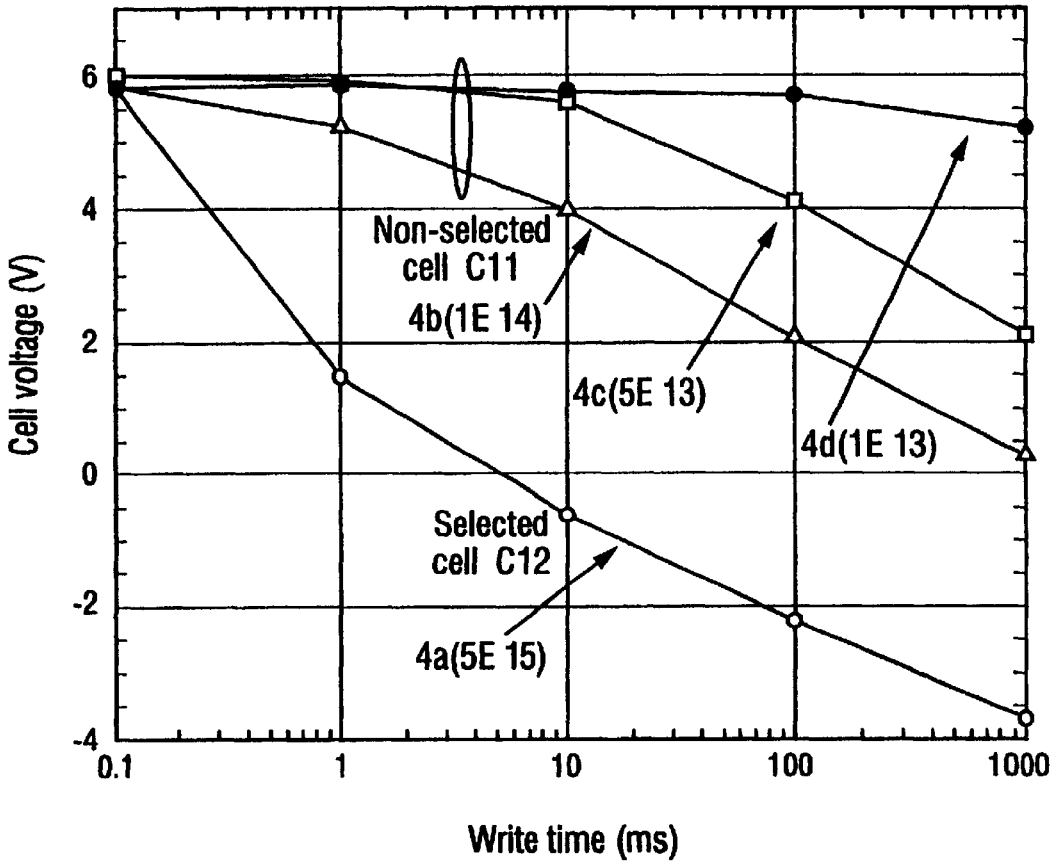
FIG. 4 shows the relationship between the impurity dose amount of a source diffusion layer and the influence of the write operation to a non-selected cell.

Now, the influence given to a non-selected cell (e.g., the memory cell $C_{11}$) by the write operation for a selected cell (e.g., the memory cell $C_{12}$) will be described. FIG. 4 shows a change in the cell voltage (threshold) of the non-selected cell $C_{11}$ when the impurity dose amount of the source diffusion layer 2b is changed. A curve 4a represents the change in the threshold voltage when data is written in a memory cell of which drain diffusion layer 2a has a impurity dose amount of $5\times10^{15}/cm^2$, while curves 4b to 4d represent changes in the threshold voltage when the same voltage as that applied to the drain diffusion layer in the write operation is applied to the source diffusion layer of memory cells of which source diffusion layer 2b has a impurity dose amount of $1\times10^{14}/cm^2$, $5\times10^{13}/cm^2$, and $1\times10^{13}/cm^2$, respectively.

As is observed-from the curve 4a, when a negative high voltage is applied to the drain diffusion layer of the selected cell $C_{12}$, electrons are drawn from the floating gate, lowering the threshold value. When this voltage application is retained for 10 ms or longer, the threshold voltage of the selected cell $C_{12}$ falls below 0 V. At this time, as shown in curves 4c and 4d, the threshold voltage of the non-selected cell $C_{11}$ of which source diffusion layer is in contact with the drain diffusion layer of the selected cell $C_{12}$ hardly changes when the impurity dose amount of the source diffusion layer 2b is $5\times10^{13}/cm^2$ or less. The threshold voltage of the non-selected cell $C_{11}$ is 4 V even when a high voltage is applied to the selected cell $C_{12}$ for 100 ms. In the case where the impurity dose amount of the source diffusion layer 2b is $1\times10^{13}/cm^2$ (curve 4d), the threshold voltage of the non-selected cell $C_{11}$ hardly changes when a high voltage is applied to the selected cell $C_{12}$ for 1000 ms. Thus, by appropriately setting the impurity dose amount of the source diffusion layer 2b, the nonselected cell adjacent to the selected cell is not influenced by the write operation for the selected cell even though the diffusion layer 2 is shared with the selected cell. This makes it possible to write data only in the selected cell.

Figure 5:
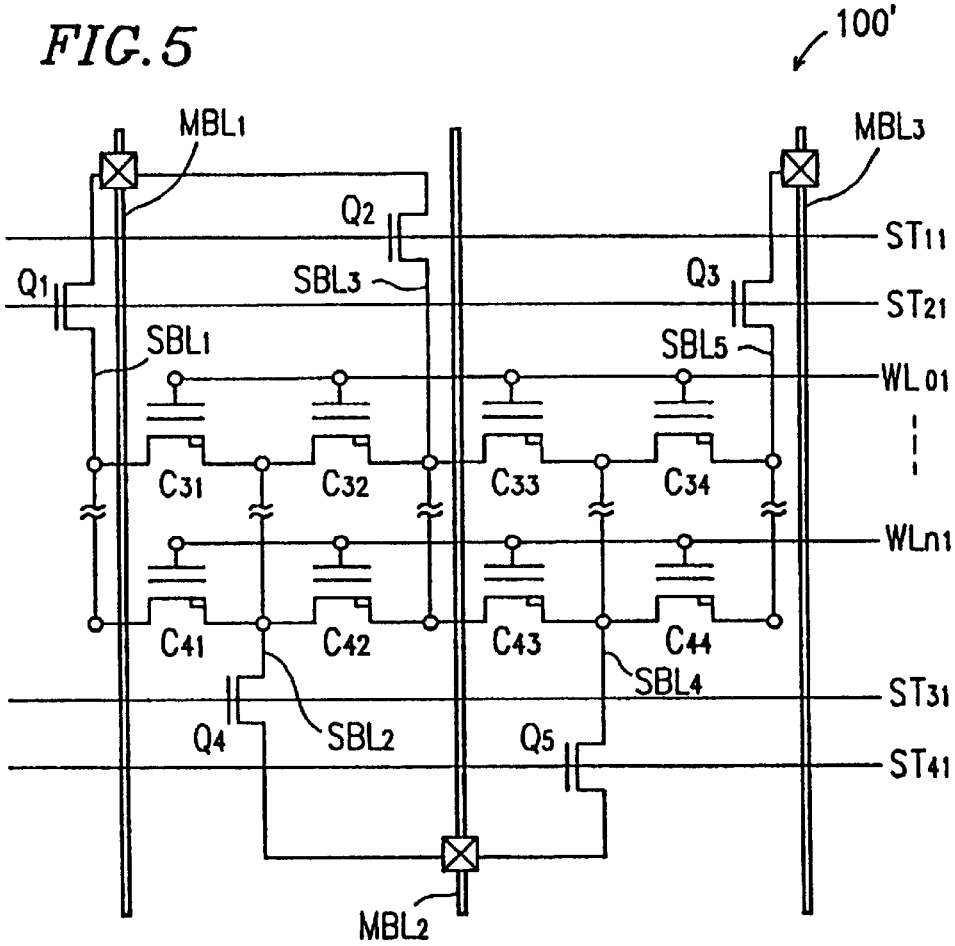
FIG. 5 is a plan view illustrating a portion of a memory cell array of a nonvolatile semiconductor memory of Example 1 according to the present invention.

FIG. 5 shows an example of an equivalent circuit of a nonvolatile semiconductor memory cell array 100' where, in order to reduce the wiring resistance of the bit line BL composed of the diffusion layers shown in FIG. 3, a sub-bit line SBL is connected to a main bit line MBL made of metal via a selective transistor.

(EXAMPLE 2)

Referring to FIGS. 6 to 10, a first example of the fabrication method of a nonvolatile semiconductor memory according to the present invention will be described. In this example, the fabrication method of the nonvolatile semiconductor memory 100 of Example 1 will be described. FIGS. 6 to 10 are sectional views taken along line A—A of FIG. 1, showing steps of the fabrication method.

Figure 6:
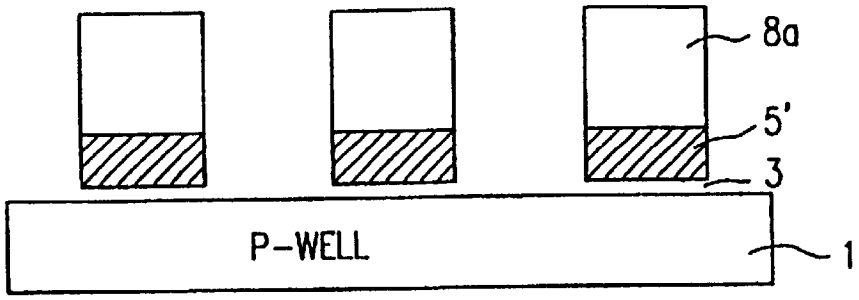
FIG. 6 is a sectional view illustrating a step of a fabrication method of memory cells of the nonvolatile semiconductor memory of Example 2 according to the present invention.

First, the field insulating films (element isolation films) 12 shown in FIG. 2B are formed on the semiconductor substrate (silicon substrate) 1. Then, the tunnel insulating film 3 with a thickness of about 80 Å is formed by thermal oxidation, and first polysilicon is deposited on the tunnel insulating film 3 to a thickness of about 1000 to 2000 Å. A first resist mask 8a with a predetermined pattern is formed on the first polysilicon by photolithography, to form first polysilicon layers 5' in a striped shape by patterning. Each of the first polysilicon layers 5' has the same width as the width in the channel direction of the floating gate 5 to be formed in a later step (FIG. 6).

Figure 7:
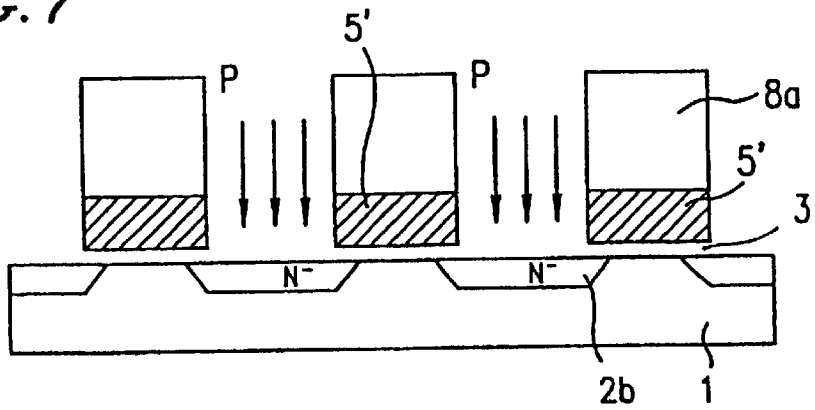
FIG. 7 is a sectional view illustrating a step of the fabrication method of the memory cells of the nonvolatile semiconductor memory of Example 2 according to the present invention.
Figure 8:
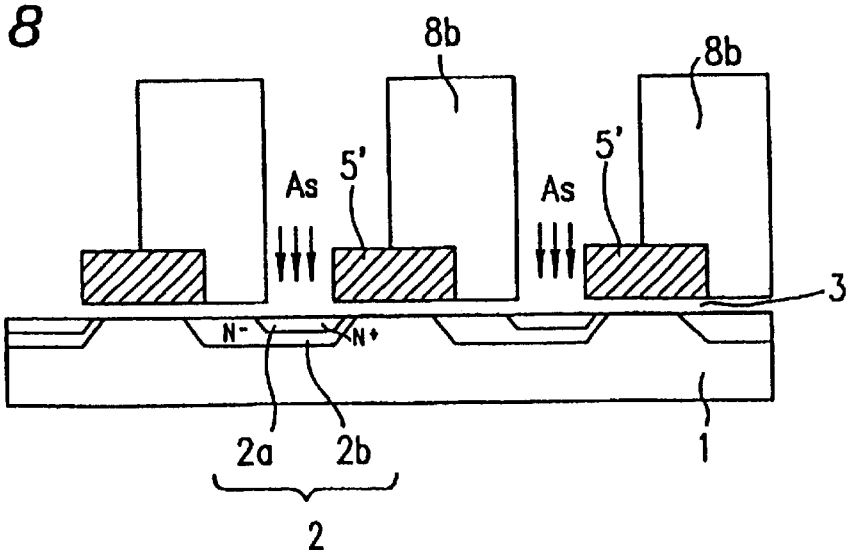
FIG. 8 is a sectional view illustrating a step of the fabrication method of the memory cells of the nonvolatile semiconductor memory of Example 2 according to the present invention.

Thereafter, phosphorous ions are implanted with an energy of 50 KeV and a dose amount of $3\times10^{13}/cm^2$. The regions where the phosphorous ions are implanted will become the low-density n-type impurity diffusion layers (source diffusion layers) 2b in a later step (FIG. 7). Then, after removing the first resist mask 8a, a second resist mask 8b with a predetermined pattern having openings corresponding to regions which will become the drain diffusion layers in a later step is formed. Using the second resist mask 8b, arsenic ions are implanted with an energy of 70 KeV and a dose amount of $1\times10^{15}/cm^2$. The regions where the arsenic ions are implanted will become the high-density N-type impurity diffusion layers (drain diffusion layers) 2a in a later step (FIG. 8). After the second resist mask 8b is removed, the resultant structure is heat-treated under a nitrogen atmosphere at 900° C. for 10 minutes, so that a DDD structure is formed in the drain diffusion layers 2a, while an LDD structure is formed in the source diffusion layers 2b. The high-density impurity diffusion layer 2a and the low-density impurity diffusion layer 2b constitute one continuous diffusion layer 2, and a series of the diffusion layers 2 in the Y direction constitute a one bit line.

Figure 9:
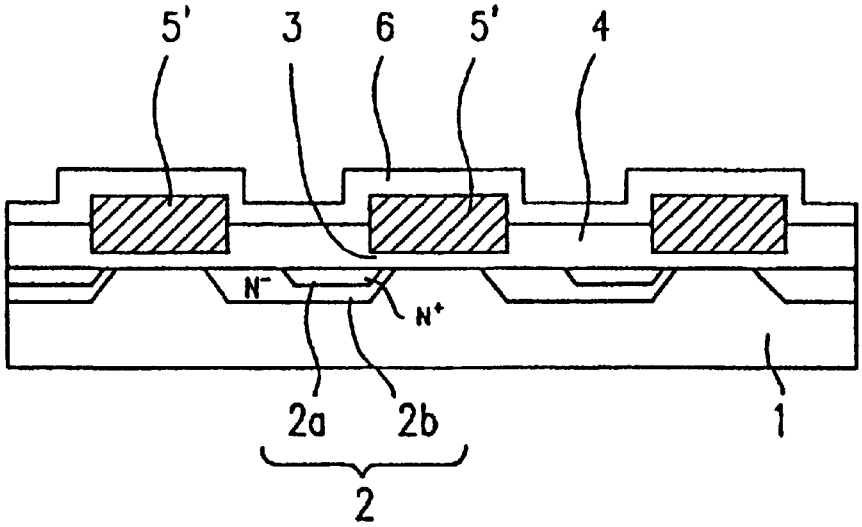
FIG. 9 is a sectional view illustrating a step of the fabrication method of the memory cells of the nonvolatile semiconductor memory of Example 2 according to the present invention.
Figure 10:
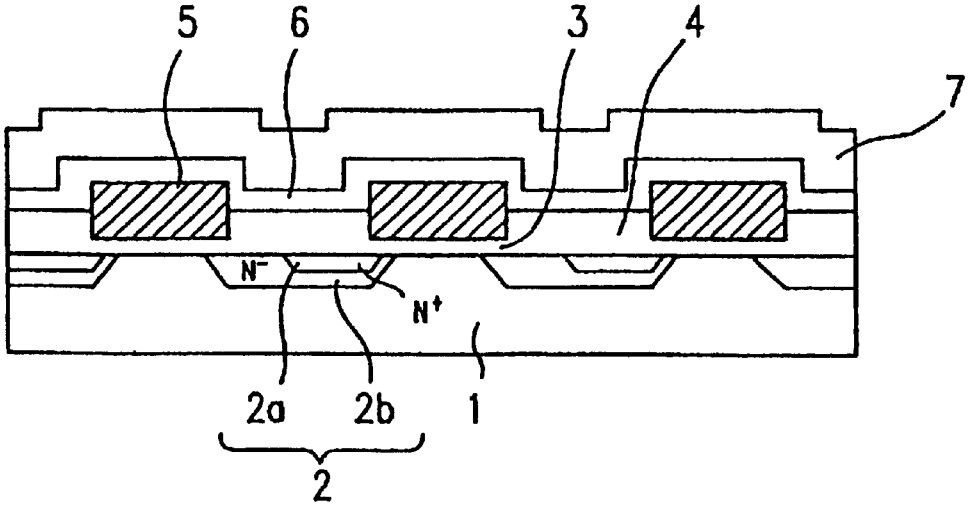
FIG. 10 is a sectional view illustrating a step of the fabrication method of the memory cells of the nonvolatile semiconductor memory of Example 2 according to the present invention.

An oxide film is formed by CVD and etched back to form oxide films 4 between the first polysilicon layers 5'. The ONO film (oxide film/nitride film/oxide film) 6 is formed on the resultant structure (FIG. 9). Then, a second polysilicon film 7' with a thickness of about 1000 Å is formed on the ONO film 6. By patterning the second polysilicon layer 7', the ONO film 6, and the first polysilicon layers 5' by photolithography (see FIG. 2B), the control gates 7, the insulating films 6, and the floating gates 5 are formed (FIG. 10). The control gates 7 of respective memory cells are formed consecutively in the X direction, forming one word line.

Alternatively, the control gates 37 (i.e., the word line WL) may be of a double-layered structure where metal silicide with a high melting point such as tungsten silicide (WSi) is deposited to a thickness of about 1000 Å on the second polysilicon layer with a thickness of about 1000 Å and these layers are patterned.

Next, an alternative fabrication method of the nonvolatile semiconductor memory according to the present invention will be described with reference to FIGS. 11A to 11D. In the above fabrication method, the first and second resist masks 8a and 8b are used. In response to the recent request for a smaller memory cell array, the spaces between the adjacent floating gates 5 are made smaller. This makes it difficult to form the second resist mask 8b. To overcome this problem, in this alternative method, both phosphorous and arsenic ions are implanted using the first resist mask 8a.

Figure 11A:
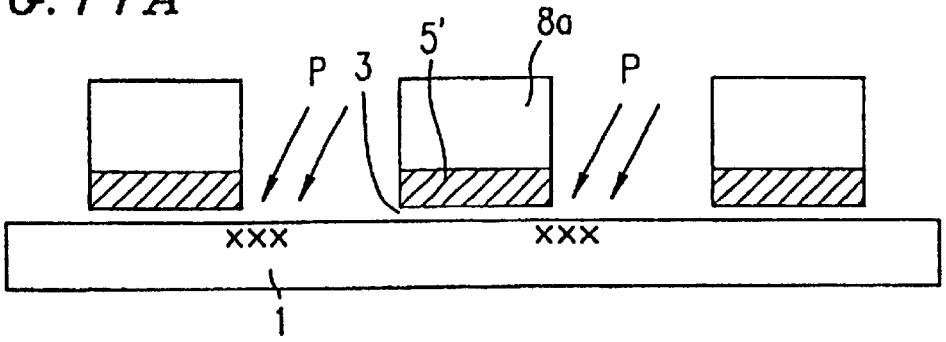
FIGS. 11A, 11B, 11C, and 11D are sectional views illustrating steps of an alternative fabrication method of memory cells of the nonvolatile semiconductor memory of Example 2 according to the present invention.

The step until the first resist mask 8a is formed on the semiconductor substrate 1 is the same as that in the above method (FIG. 6). Then, as shown in FIG. 11A, phosphorous ions are implanted to form the lowdensity impurity diffusion layer. At this time, by implanting phosphorous ions at a predetermined tilt angle (e.g., about 7° with respect to the normal of the semiconductor substrate 1), the phosphorous ions are implanted in the portions of the semiconductor substrate along one side (source side) of each of the openings of the first resist mask 8a (corresponding to the bit lines). This implantation does not form the DDD structure, but is suitable for miniaturization.

Phosphorous ions may be implanted on only the source side as described above, or, as in the case shown in FIG. 7, may be implanted so that the DDD structure is formed.

Figure 11B:
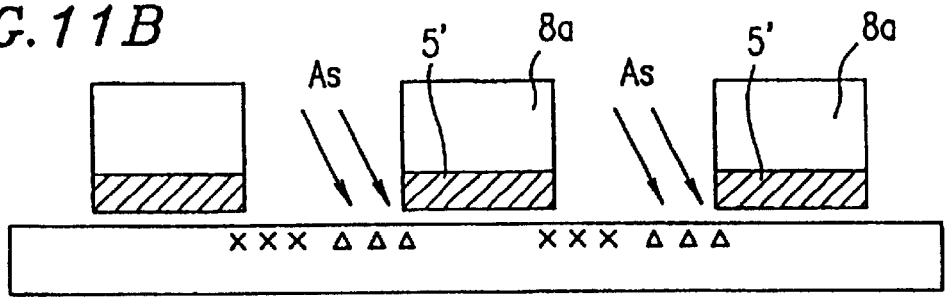
Figure 11C:
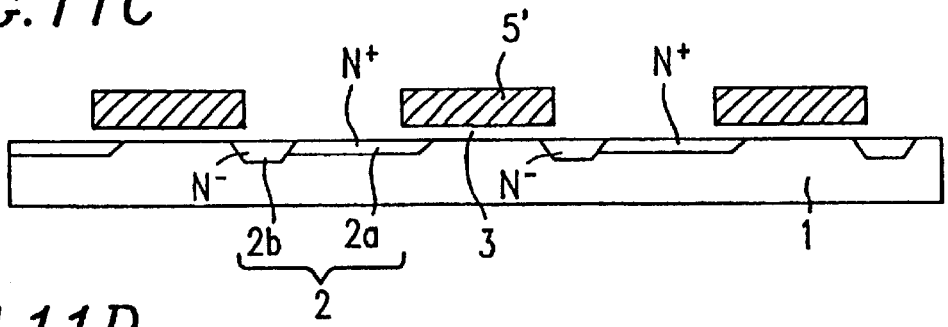
Figure 11D:
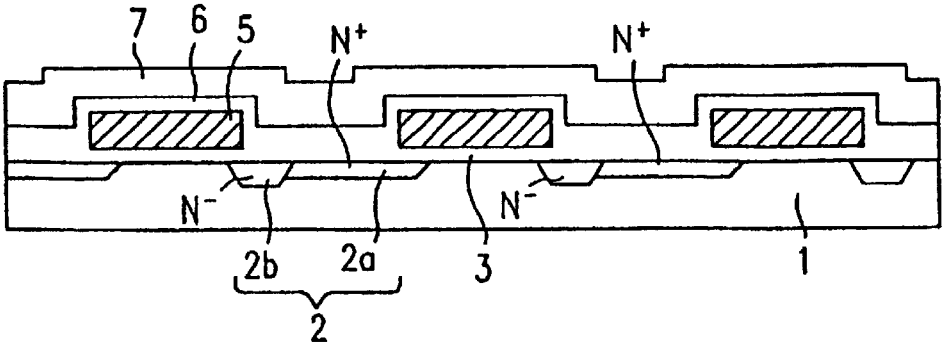

Thereafter, as shown in FIG. 11B, arsenic ions are implanted at a predetermined tilt angle (e.g., about 7° inversely with respect to the normal of the semiconductor substrate 1). Thus, arsenic ions are implanted in the portions of the semiconductor substrate along the other side (drain side) of each of the openings of the first resist mask 8a. The first resist mask 8a is then removed and the resultant structure is heat-treated, forming the diffusion layers 2 each including the highdensity N-type diffusion layer 2a on the drain side and the low-density N-type diffusion layer 2b on the source side consecutively (FIG. 11C). The ONO films 6 and the control gates 7 are then formed in a manner similar to the steps shown in FIGS. 9 and 10 (FIG. 11D).

According to the above tilt ion implantation, the step of forming the second resist mask 8b can be omitted and an allowance for alignment is not required. Thus, the cell size can be further reduced.

Figure 12A:
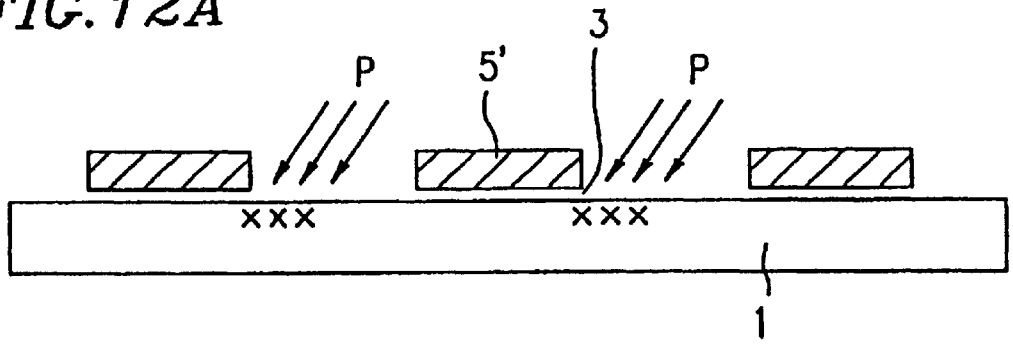
FIGS. 12A and 12B are sectional views illustrating a tilt ion injection process of another alternative fabrication method of memory cells of the nonvolatile semiconductor memory of Example 2 according to the present invention.
Figure 12B:
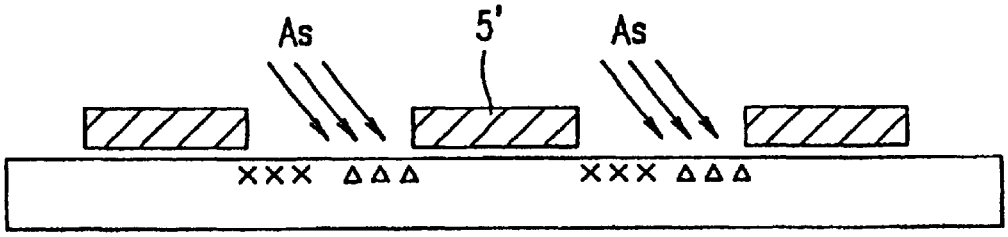

In the above alternative method, phosphorous and arsenic ions may be implanted after the removal of the first resist mask 8a as shown in FIGS. 12A and 12B. In this case, the tilt angle for ion implantation should be larger than the case using the resist mask 8a.

Figure 13A:
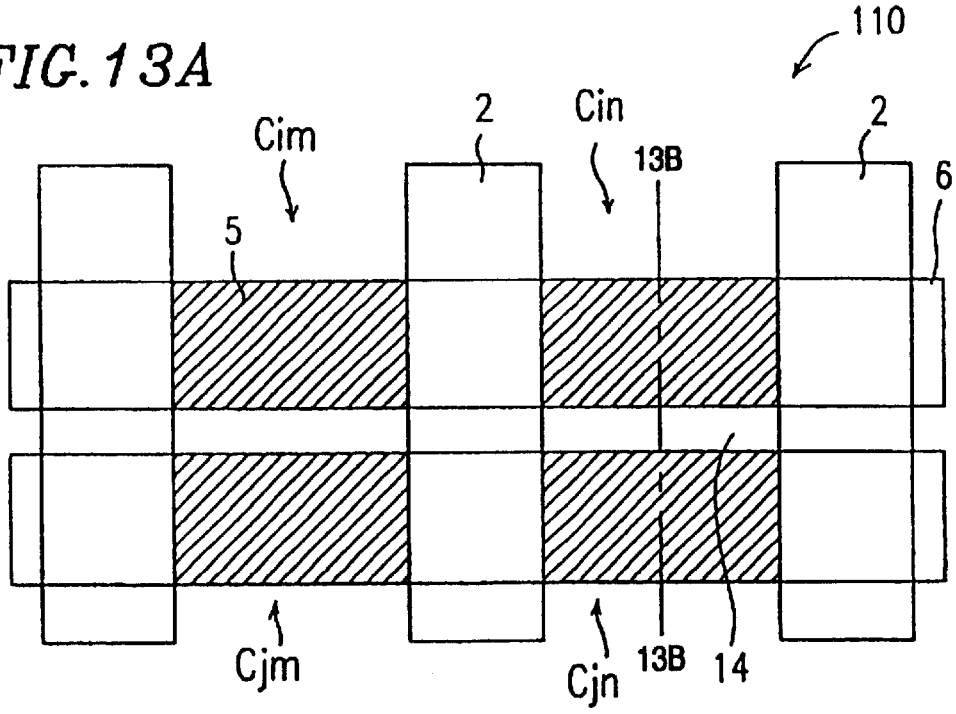
FIG. 13A is a plan view of a portion of a memory cell array of an alternative nonvolatile semiconductor memory according to the present invention, where element isolation is conducted by a p-n joint.
Figure 13B:
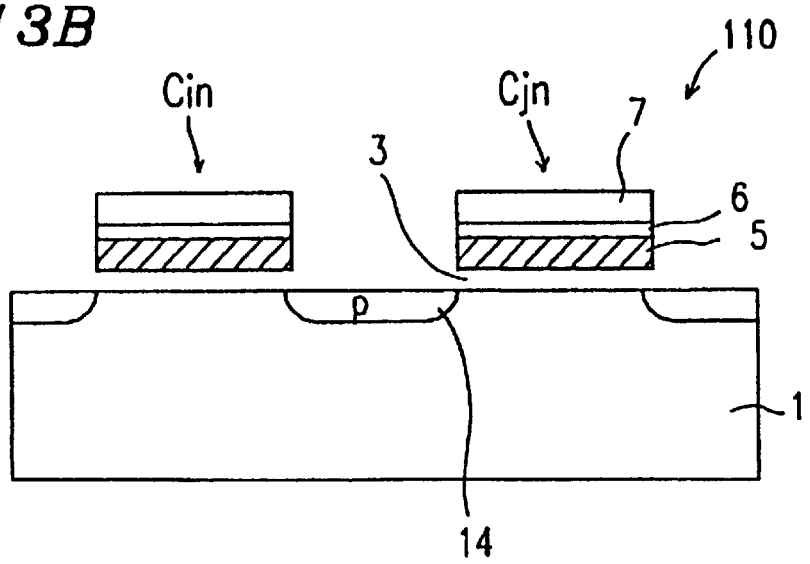
FIG. 13B is a sectional view of the memory cells shown in FIG. 13A taken along line D—D of FIG. 13A.

FIGS. 13A and 13B show an alternative nonvolatile semiconductor memory according to the present invention. A nonvolatile semiconductor memory 110 does not include the field oxide films 12 (see FIG. 2B) on the semiconductor substrate 1, but includes p-type impurity diffusion layers 14 to isolate memory cells lined in the Y direction from one another.

The fabrication process of the nonvolatile semiconductor memory 110 is almost the same as those described above (see FIGS. 6 to 10, 11A to 11D, and 12A and 12B). The p-type impurity diffusion layers 14 for element isolation are formed by implanting phorone ions with an energy of 40 KeV and a dose amount of $1\times10^{13}/cm^2$ using the control gates (word lines) as the mask after the formation of the control gates (word lines) (FIG. 13B).

Since a pattern for forming an element isolation film is not required, the distance between the memory cells adjacent in the Y direction can be made smaller to the limit of the resolution for photolithography.

(EXAMPLE 3)

Figure 14:
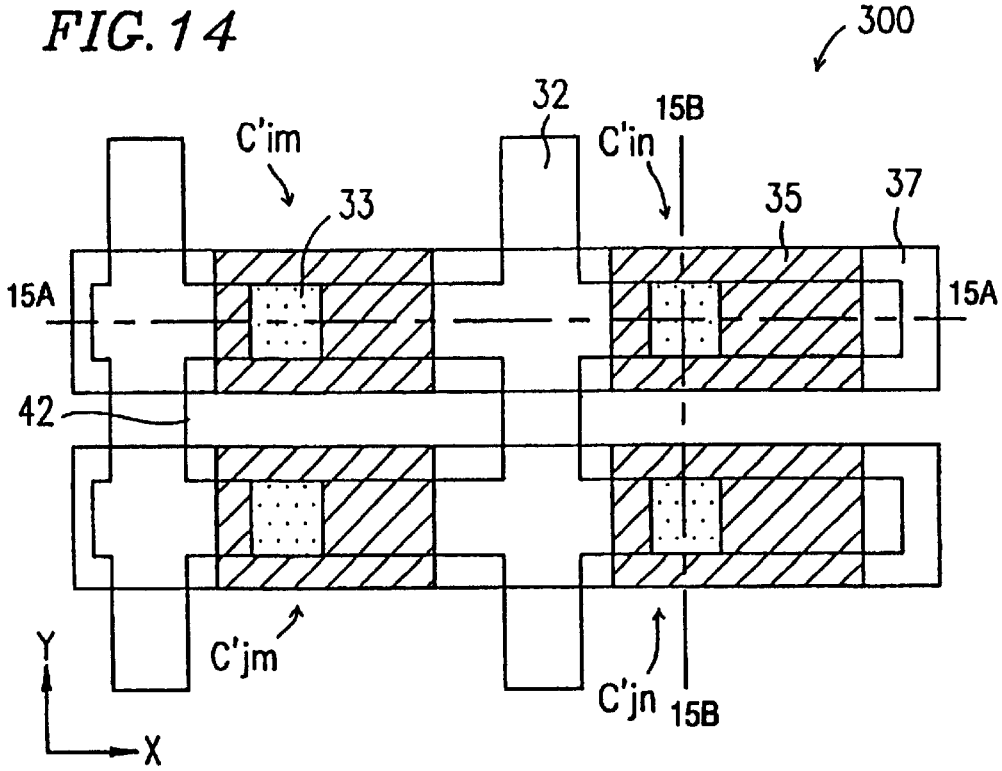
FIG. 14 is a plan view of a portion of a memory cell array of a nonvolatile semiconductor memory of Example 3 according to the present invention.
Figure 15A:
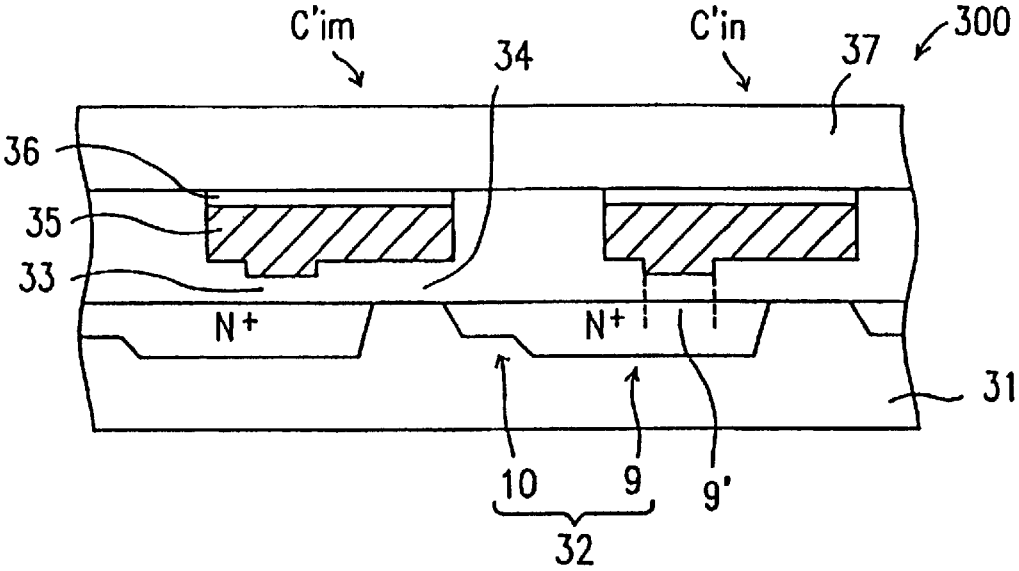
FIGS. 15A and 15B are sectional views of the memory cell array shown in FIG. 14 taken along lines A—A and B—B of FIG. 14, respectively.
Figure 15B:
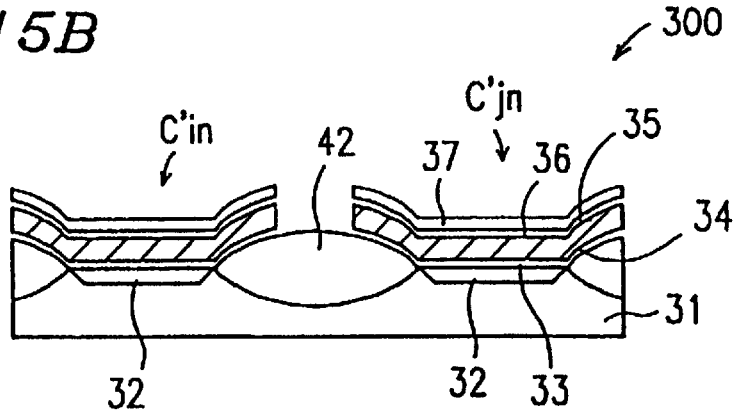
Figure 16:
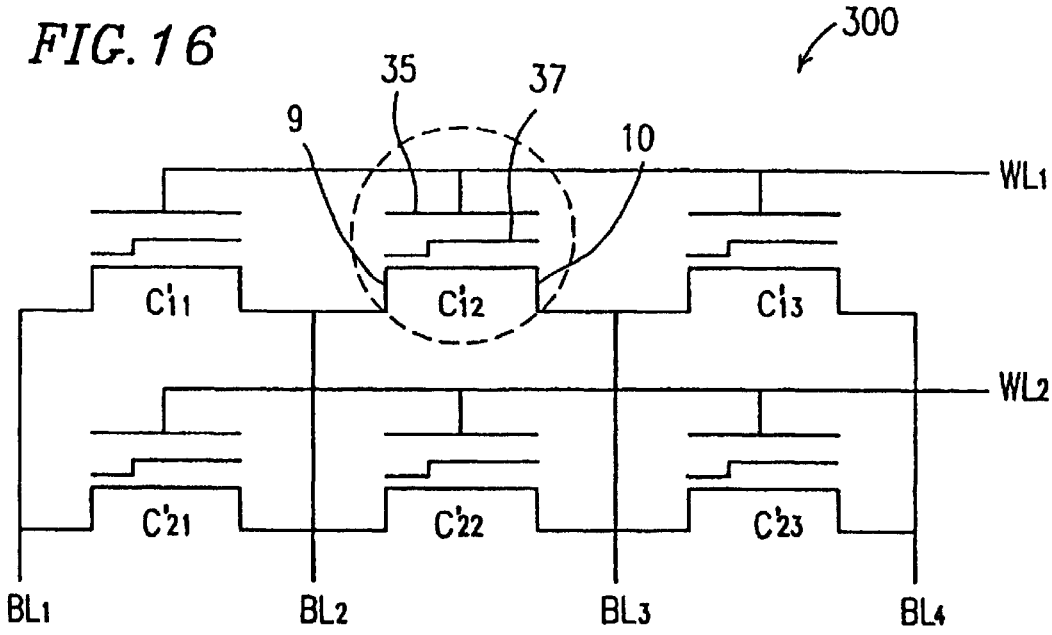
FIG. 16 is an equivalent circuit diagram of the memory cell array of the nonvolatile semiconductor memory of Example 3 according to the present invention.

FIG. 14 is a plan view of a portion of a memory cell array of a nonvolatile semiconductor memory 300 of Example 4 according to the present invention. FIGS. 15A and 15B are sectional views of the nonvolatile semiconductor memory 300 taken along lines A—A and B—B of FIG. 14, respectively, Referring to FIGS. 14, 15A, and 15B, the nonvolatile semiconductor memory 300 includes a plurality of memory cells C' formed in a matrix on a semiconductor substrate 31. In FIG. 14, the respective memory cells C' are denoted by individual codes such as $C'_{im}$. Each of the memory cells C' includes a floating gate 35 formed on the semiconductor substrate 31 via an insulating film. A control gate 37 is formed on the floating gate 35 via an insulating film 36 made of ONO and the like. Such control gates 37 extend in a channel direction of the memory cell C' (an X direction shown in FIG. 14), constituting a word line WL as shown in FIG. 16 for connecting the memory cells C' lined in the X direction.

As shown in FIGS. 14 and 15A, a high-density n-type diffusion layer 32 is formed between two memory cells adjacent in the X direction (e.g., memory cells $C'_{im}$ and $C'_{in}$). The diffusion layer 32 includes a drain diffusion layer 9 for one of the two adjacent memory cells (e.g.; the memory cell $C'_{im}$) and a source diffusion layer 10 for the other memory cell (e.g., the memory cell $C'_{in}$). The diffusion layer 32 is thus shared by the two adjacent memory cells.

As shown in FIGS. 14 and 15A, a tunnel insulating film 33 and a gate insulating film 34 are formed underneath each of the floating gate 35. The tunnel insulating film 33 is formed above the diffusion layer 32 and thinner than the gate insulating film 34. Thus, when a predetermined voltage is applied between the floating gate 35 and the semiconductor substrate 31, a tunnel current flows through the tunnel insulating film 33, while it does not flow through the gate insulating film 34.

In each memory cell C', the floating gate 35 is capacitively coupled with the drain diffusion layer 9 of one of the two diffusion layers 32 located on both sides of the memory cell C' via the tunnel insulating film 33 on the drain side (defining a tunnel region 9'), while it is capacitively coupled with the source diffusion layer 10 of the other diffusion layer 32 via the gate insulating film 34 on the source side. Thus, the transistor of the memory cell C' in this example is an asymmetric transistor where the insulating film is formed asymmetrically between the drain side and the source side. The tunnel insulating film 33 may be composed of a silicon oxide film or a lamination of a silicon oxide film and a silicon nitride film.

In this example, the diffusion layers 32 lined in the Y direction are connected with one another via diffusion layer wirings, forming a so-called buried bit line. Alternatively, the diffusion layers 32 may be electrically connected via metal wirings. In the latter case, a contact region is required for each diffusion layer 32. As shown in FIG. 15B, a field oxide film (element isolation film) 42 is formed between the floating gates 35 of two adjacent memory cells in the Y direction (e.g., the memory cells $C'_{in}$ and $C'_{jn}$).

As shown in the equivalent circuit of FIG. 16, the nonvolatile semiconductor memory 300 employs the virtual ground method, where bit lines BL (bit lines $BL_1$ to $BL_4$ are shown in FIG. 16) serve as the source wirings or the drain wirings depending on the selected cell.

The operation of the nonvolatile semiconductor memory 300 will now be described. Table 2 below shows the operation conditions when the memory cell $C'_{12}$ shown in FIG. 16 is selected, for example.

TABLE 2

| Operation | Word line voltage (V) | | Bit line voltage (V) | | | |
|---|---|---|---|---|---|---|
| | Selected | Non-selected | | | | |
| mode | $WL_1$ | $WL_2$ | $BL_1$ | $BL_2$ | $BL_3$ | $BL_4$ |
| Write | −6 | 0 | Float | 3 | Float | Float |
| Erase | 12 | 0 | 0 | 0 | 0 | 0 |
| Read | 3 | 0 | 0 | 0 | 1 | 1 |

In the write operation, a negative high voltage $V_{H1}$ (e.g., −6 V) is applied to the word line $WL_1$ connected with the control gate 37 of the memory cell $C'_{12}$, while 0 V is applied to the other word lines. A predetermined positive voltage $V_{cc}$ (e.g., 3 V) is applied to the bit line $BL_2$ connected with the drain of the memory cell $C'_{12}$, while the other bit lines are put in the floating state. In the memory cell $C'_2$ of the above state, a tunnel current flows from the drain diffusion layer 9 to the floating gate 35 via the tunnel insulating film 33 due to the electric field applied between the floating gate 35 and the drain diffusion layer 9, allowing data to be written in the memory cell $C'_{12}$.

The same write voltage is also applied to the control gate 37 of the non-selected cell $C'_{11}$, which is connected with the word line $WL_1$ and the source diffusion layer 10 of the bit line $BL_2$. However, since the comparatively thick gate insulating film 34 which does not cause the tunnel phenomenon is formed above the source diffusion layer 10, no tunnel current flows between the source diffusion layer 10 and the floating gate 35 of the non-selected cell $C'_{11}$. Accordingly, though the non-selected cell shares the diffusion layer 32 with the selected cell, no data is written in the non-selected cell.

In the erase operation, first, 0 V is applied to all the bit lines BL. Then, a positive high voltage $V_{H2}$ (e.g., 12 V) is applied to a desired word line WL. This allows electrons to be injected into the floating gates 35 of a plurality of memory cells simultaneously, and thus data stored in the memory cells are erased at one time. For example, when a high voltage $V_{H2}$ is applied to the word line $WL_1$, data in the memory cells $C'_{11}$, $C'_{12}$, and $C'_{13}$ are erased at one time. When a high voltage $V_{H2}$ is applied to the word line $WL_2$, data in the memory cells $C'_{21}$, $C'_{22}$, and $C'_{23}$ are erased at one time.

The data reading from the selected cell $C'_{12}$ is conducted in a conventional manner. First, a predetermined voltage $V_{cc}$ (e.g., 3 V) is applied to the word line $WL_1$. Simultaneously, a predetermined voltage $V_L$ (e.g., 1 V) is applied to the bit line $BL_3$, and 0 V is applied to the bit line $BL_2$. Data is read by detecting a current flowing between these bit lines.

Figure 17:
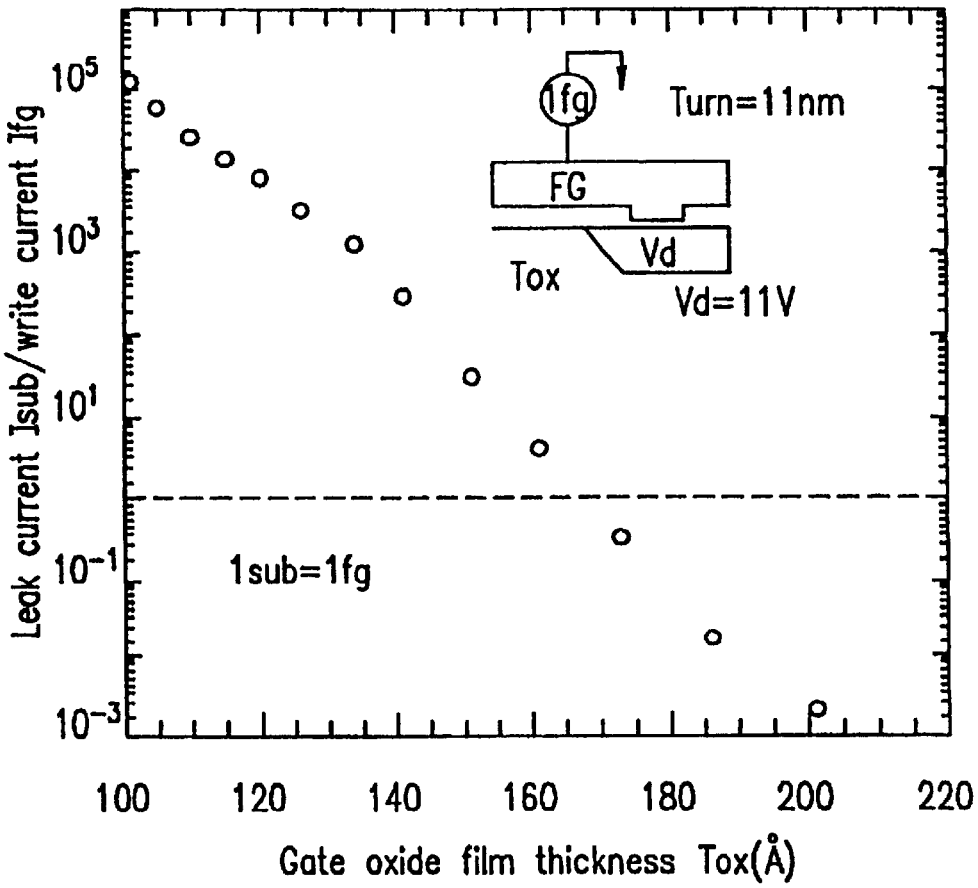
FIG. 17 shows the relationship between the thickness of a gate insulating film and the write efficiency (leak current/tunnel current).

Now, the dependency of the current flowing into the semiconductor substrate 31 upon the thickness of the gate insulating film 34 when a predetermined voltage is applied to the floating gate 35 in the write operation will be described. FIG. 17 is a graph plotting the ratio of the leakage current (i.e., the current flowing into the semiconductor substrate 31) to the write current (i.e., the tunnel current flowing between the drain diffusion layer 9 and the floating gate 35) with respect to the thickness of the gate insulating film 34. The thickness of the tunnel insulating film 33 is 11 nm (110 Å). As is observed from FIG. 17, when the thickness of the gate insulating film 34 is 17 nm or more, the leakage current flowing into the semiconductor substrate 31 is smaller than the tunnel current. Thus, by comparatively thickening the gate insulating film 34, the write efficiency can be improved. Since the voltage applied in the write operation can be reduced by thinning the tunnel insulating film 33, the gate insulating film 34 can be thinned in proportion to the thinning of the tunnel insulating film 33. Also, the voltage can be lower than the case of the memory cells in Example 1.

In this example, the asymmetric memory cell can be realized by varying the thickness of the gate insulating film. Alternatively, it can be realized by forming the tunnel insulating film of a different material from that of the other portion of the insulating film.

Figure 18:
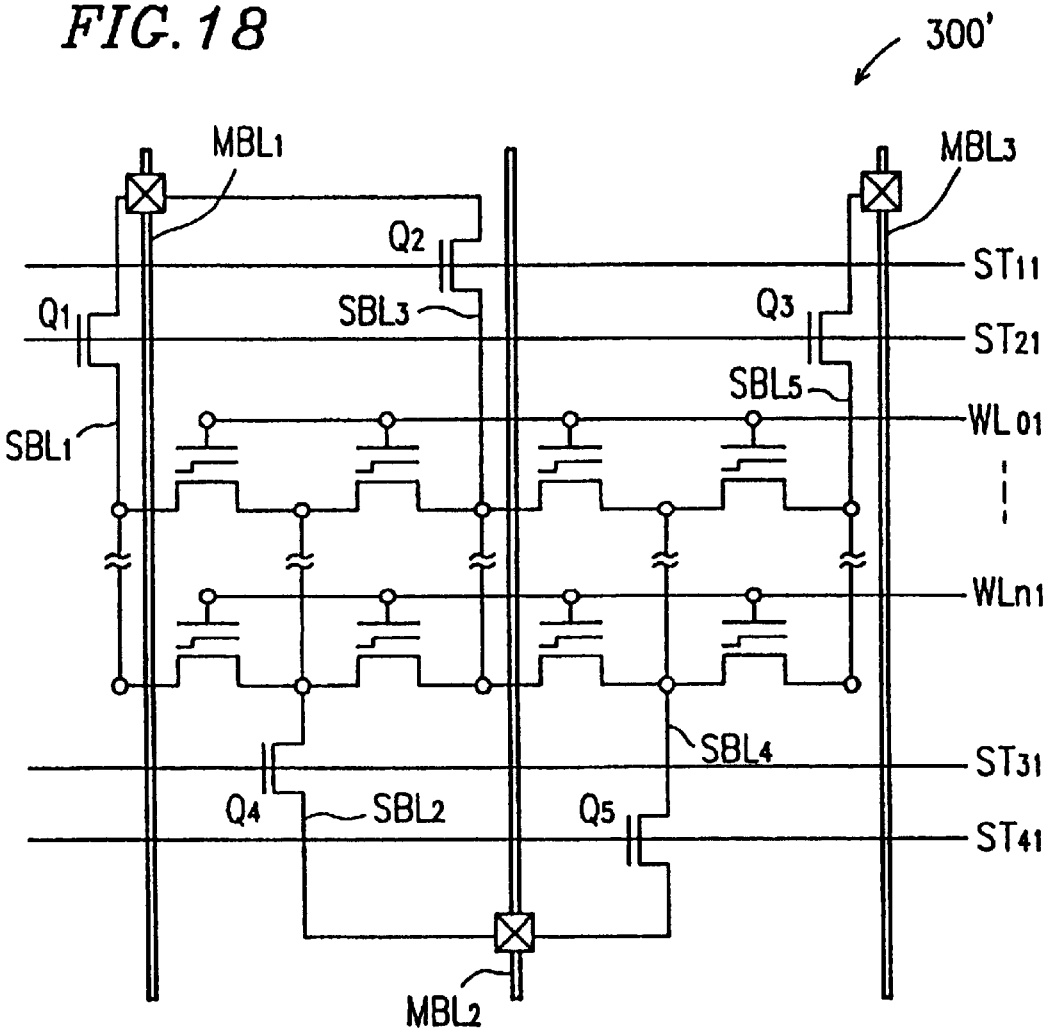
FIG. 18 is a plan view of a portion of a memory cell array of an alternative nonvolatile semiconductor memory according to the present invention.

FIG. 18 shows an example of an equivalent circuit of a nonvolatile semiconductor memory cell array 420 where, in order to reduce the wiring resistance of the bit line BL composed of the diffusion layers shown in FIG. 16, a sub-bit line SBL is connected to a main bit line MBL made of metal via a selective transistor.

(EXAMPLE 4)

Referring to FIGS. 19 to 23, a second example of the fabrication method of a nonvolatile semiconductor memory according to the present invention will become described. In this example, the fabrication method of the nonvolatile semiconductor memory 300 shown in FIG. 14 will be described.

Figure 19:
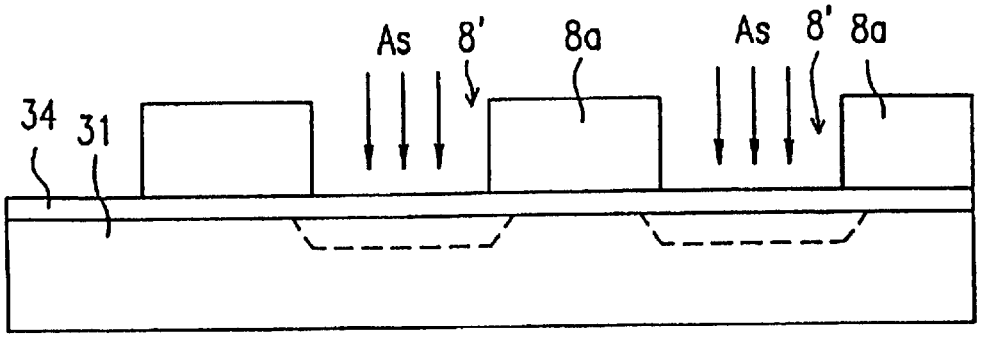
FIG. 19 is a sectional view illustrating a step of a fabrication method of memory cells of a nonvolatile semiconductor memory of Example 4 according to the present invention.

First, the field insulating films (element isolation films) 42 shown in FIG. 15B are formed on the semiconductor substrate (silicon substrate) 31. Then, the gate insulating film 34 with a thickness of about 200 Å(20 nm) is formed by thermal oxidation. A first resist mask 8a with a predetermined pattern is formed on the gate insulating film 34 by photolithography. The first resist mask 8a has openings 8' at positions corresponding to regions which will become drain diffusion layers 9 in a later step. Arsenic ions are implanted using the first resist mask 8a with an energy of 70 KeV and a dose amount of $5\times10^{15}/cm^2$ (FIG. 19).

Figure 20:
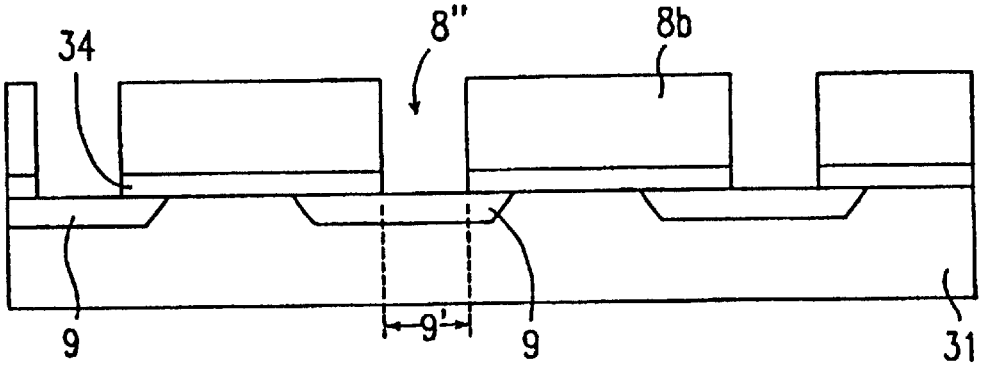
FIG. 20 is a sectional view illustrating a step of the fabrication method of the memory cells of the nonvolatile semiconductor memory of Example 4 according to the present invention.

After the first resist mask 8a is removed, the resultant structure is heat-treated under a nitrogen atmosphere at 900° C. for 30 minutes so that the drain diffusion layers 9 which are high-density n-type diffusion layers are formed. Thereafter, a second resist mask 8b with a predetermined pattern having openings 8" corresponding to regions which will become tunnel regions 9' in a later step is formed by photolithography. Using the second resist mask 8b, the portions of the gate insulating film 34 located above the tunnel regions 9' are removed (FIG. 20).

Figure 21:
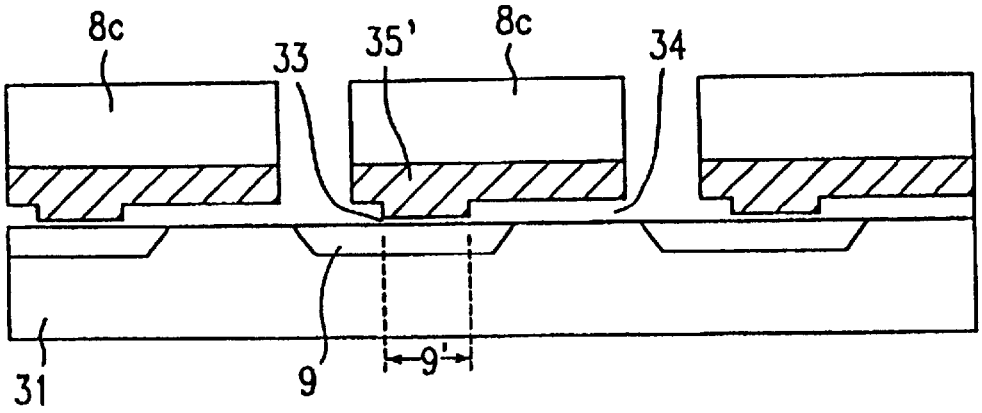
FIG. 21 is a sectional view illustrating a step of the fabrication method of the memory cells of the nonvolatile semiconductor memory of Example 4 according to the present invention.

The tunnel insulating films 33 with a thickness of about 80 Å are formed in the tunnel regions 9', and first polysilicon is deposited on the insulting films to a thickness of about 1500 Å. A third resist mask 8c with a predetermined pattern is formed on the first polysilicon by photolithography. Using the third resist mask 8c, the first polysilicon is patterned to form first polysilicon layers 35' in a striped shape. Each of the first polysilicon layers 35' has the same width as the width in the channel direction of the floating gates 35 to be formed in a later step (FIG. 21).

Figure 22:
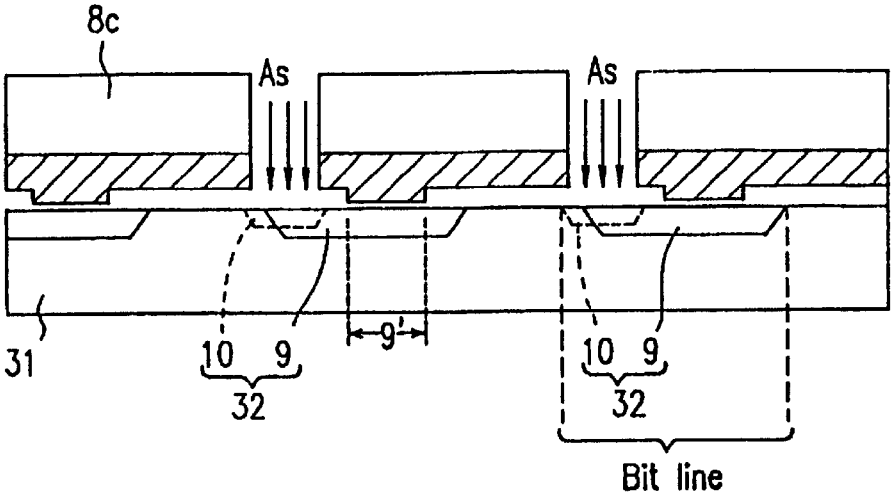
FIG. 22 is a sectional view illustrating a step of the fabrication method of the memory cells of the nonvolatile semiconductor memory of Example 4 according to the present invention.

Thereafter, using the first polysilicon layer 35' as the mask, arsenic ions are implanted with an energy of 70 KeV and a dose amount of $1\times10^{15}/cm^2$(FIG. 22). After the third resist mask 8c is removed, the resultant structure is heat-treated under a nitrogen atmosphere at 900° C. for 30 minutes, thereby to form the source diffusion layers 10. The source diffusion layer 10 of each memory cell is in contact with the drain diffusion layer 9 of an adjacent memory cell, jointly forming the diffusion layer (bit line) 32.

Figure 23:
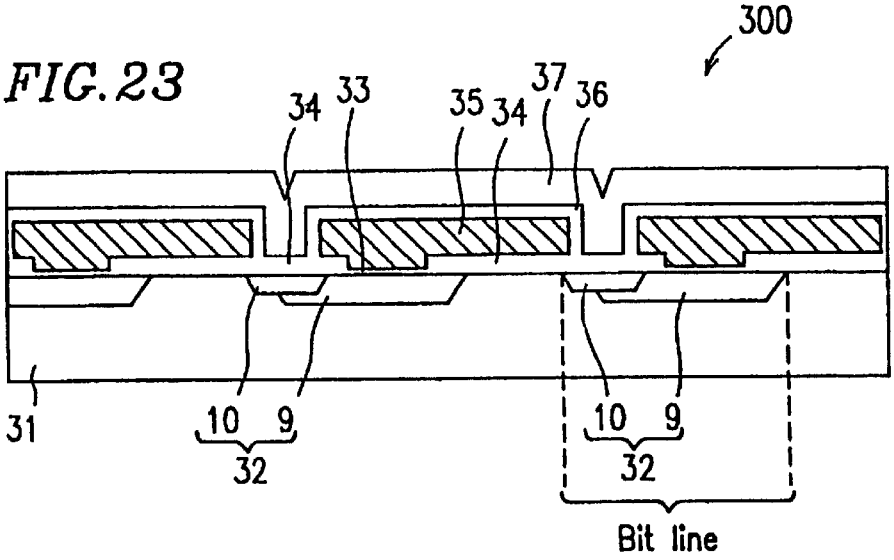
FIG. 23 is a sectional view illustrating a step of the fabrication method of the memory cells of the nonvolatile semiconductor memory of Example 4 according to the present invention.

The ONO film (oxide film/nitride film/oxide film) 36 is formed on the resultant structure by CVD, and then a second polysilicon layer 37' with a thickness of about 1000 Å is formed on the ONO film 36. The second polysilicon layer 37', the ONO film 36, and the first polysilicon layers 35' are then patterned by photolithography (see FIG. 15B), to form the control gates 37, the insulating films 36, and the floating gates 35 (FIG. 23). The control gates 37 of the respective memory cells are formed consecutively, forming the word line.

Alternatively, the control gates (word line) 37 may be of a double-layered structure where metal silicide with a high melting point such as tungsten silicide (WSi) is deposited to a thickness of about 1000 Å on the second polysilicon layer with a thickness of about 1000 Å and these layers are patterned.

Next, an alternative fabrication method of the nonvolatile semiconductor memory according to the present invention will be described with reference to FIGS. 24 to 28. In the above fabrication method, in order to cover the entire tunnel region with the diffusion layer, two different masks 8a and 8b for ion implanting to form the drain diffusion layer and to define the tunnel region, respectively, are used. Since allowances for aligning the respective masks are required at the formation of these masks, the size reduction of the memory cells is restricted. To overcome this problem, in this alternative method, impurity ions are implanted using the mask for defining the tunnel region, so as to form the diffusion layer in the tunnel region in a self-alignment manner.

Figure 24:
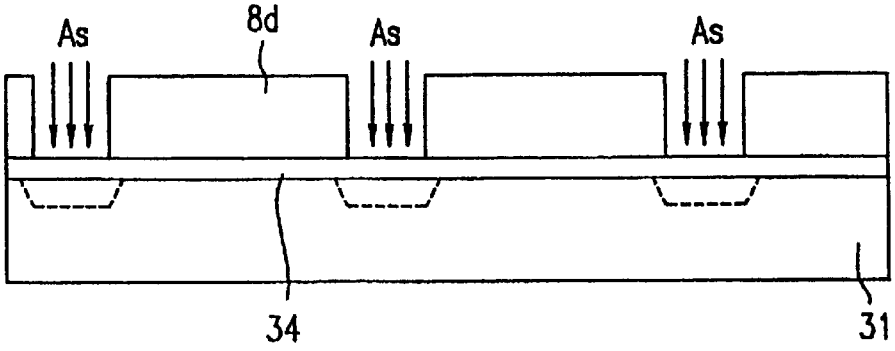
FIG. 24 is a sectional view illustrating a step of an alternative fabrication method of the memory cells of the nonvolatile semiconductor memory of Example 4 according to the present invention.
Figure 25:
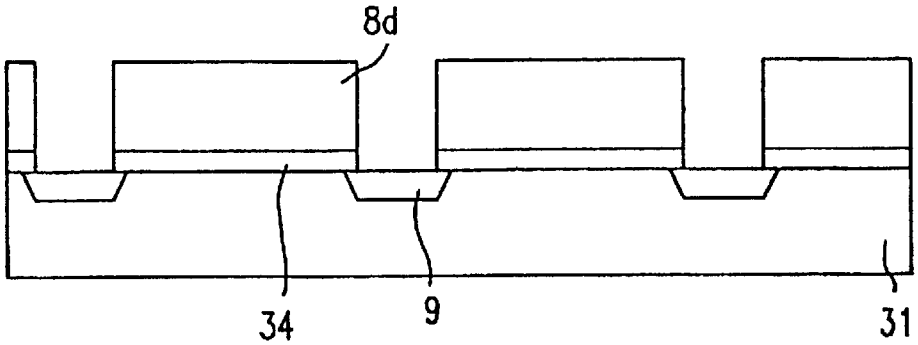
FIG. 25 is a sectional view illustrating a step of the alternative fabrication method of the memory cells of the nonvolatile semiconductor memory of Example 4 according to the present invention.

First, as in the above fabrication method, the gate insulating film (first gate insulating film) 34 with a thickness of about 200 Å (20 nm) is formed by thermal oxidation on the semiconductor substrate 31 having the field insulating films (element isolation films) 42 formed thereon. A resist mask 8d with a predetermined pattern having openings corresponding to regions which will become tunnel regions in a later step is formed on the gate insulating film by photolithography. Using the resist mask 8d, arsenic ions are implanted with an energy of 70 KeV and a dose amount of $5\times10^{15}/cm^2$ (FIG. 24). Then, still using the resist mask 8d, the portions of the gate insulating film 34 located above the tunnel regions are removed (FIG. 25).

Figure 26:
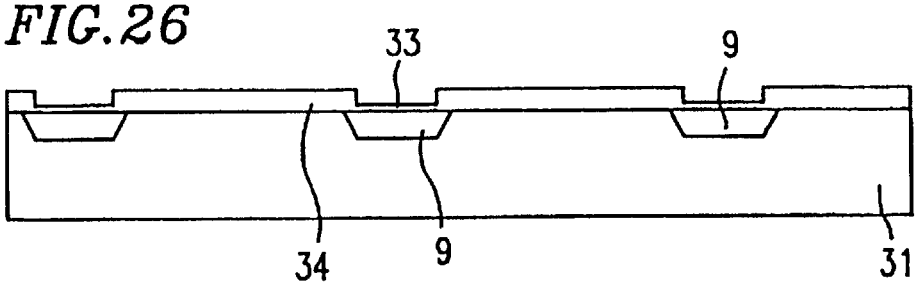
FIG. 26 is a sectional view illustrating a step of the alternative fabrication method of the memory cells of the nonvolatile semiconductor memory of Example 4 according to the present invention.

After the resist mask 8d is removed, the resultant structure is heat-treated under a nitrogen atmosphere at 900° C. for 10 minutes, forming the drain diffusion layers 9 which are high-density n-type diffusion layers. The tunnel insulating films (second gate insulating films) 33 with a thickness of about 80 Å are then formed by thermal oxidation at 900° C. for 10 minutes (FIG. 26).

Figure 27:
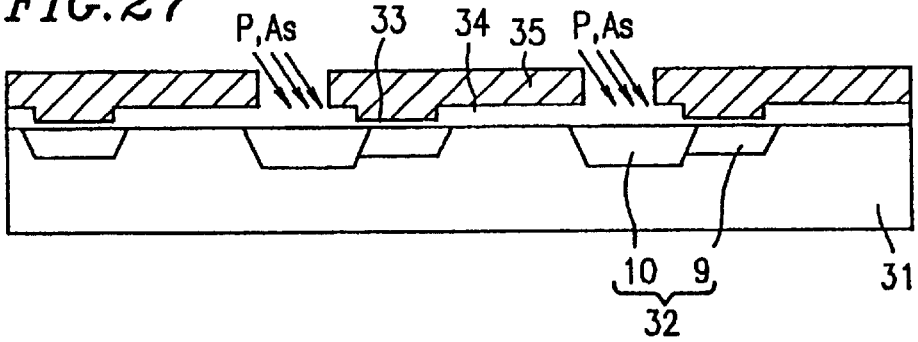
FIG. 27 is a sectional view illustrating a step of the alternative fabrication method of the memory cells of the nonvolatile semiconductor memory of Example 4 according to the present invention.

A fist polysilicon film with a thickness of about 1000 to 2000 Å is formed, which is then patterned by photolithography using a resist mask with a predetermined pattern to form the first polysilicon layers 35' in a striped shape. Each of the first polysilicon layers 35' has the same width as the width in the channel direction of the floating gates 35 to be formed in a later step. After the resist mask is removed, phosphorous ions are implanted at a tilt angle of about 45° with respect to the normal of the semiconductor substrate 31 (tilt ion implantation) with an energy of 30 KeV and a dose amount of 1 to $5\times10^{14}/cm^2$. Subsequently, still using the first polysilicon layers 35' as the mask, arsenic ions are implanted by tilt ion implantation with an energy of 70 KeV and a dose amount of $1\times10^{15}/cm^2$ (FIG. 27). Only one-time implantation of either phosphorous ions or arsenic ions is acceptable. However, the contact with the diffusion layers 9 under the tunnel insulating films 33 can be more ensured by the two-time implantation of phosphorous ions and arsenic ions as described above. Thereafter, the source diffusion layers 10 are formed by predetermined heat-treatment. The source diffusion layer 10 of one memory cell is in contact with the drain diffusion layer 9 of an adjacent memory cell, jointly forming the diffusion layer (bit line) 32.

Figure 28:
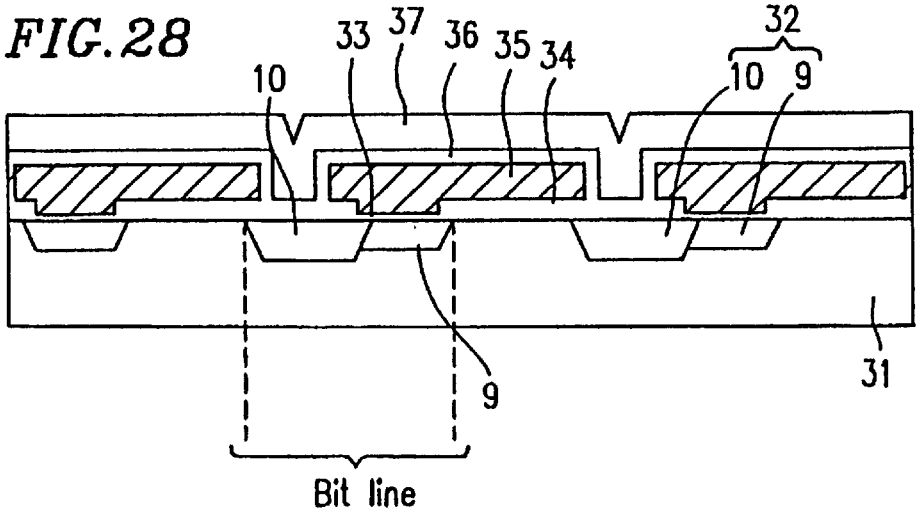
FIG. 28 is a sectional view illustrating a step of the alternative fabrication method of the memory cells of the nonvolatile semiconductor memory of Example 4 according to the present invention.

The ONO film 36 is formed on the resultant structure by CVD, and then the second polysilicon layer 37' with a thickness of about 1000 Å is formed on the ONO film 36. The second polysilicon layer 37', the ONO film 36, and the first polysilicon layers 35' are then patterned (see FIG. 15B) to form the control gates 37, the insulating films 36 and the floating gates 35 (FIG. 28). The control gates 37 of the respective memory cells are formed consecutively, forming the word line.

Alternatively, the control gates (word line) 37 may have a double-layered structure where metal silicide with a high melting point such as tungsten silicide (WSi) is deposited to a thickness of 1000 Å on the second polysilicon layer of a thickness of about 1000 Å and these layers are patterned.

Thus, according to this example, since the bit line is shared by two adjacent memory cells, the memory cell structure is simplified and the cell size can be reduced. Since all the tunnel regions are formed above the diffusion layers (especially, the drain diffusion layers), a leakage current from the diffusion layers to the semiconductor substrate in the write operation can be reduced. This improves the write efficiency and lowers the power consumption. Since no electron/hole trapping due to the leakage current occurs, the reliability of the memory cells can be improved.

Figure 29A:
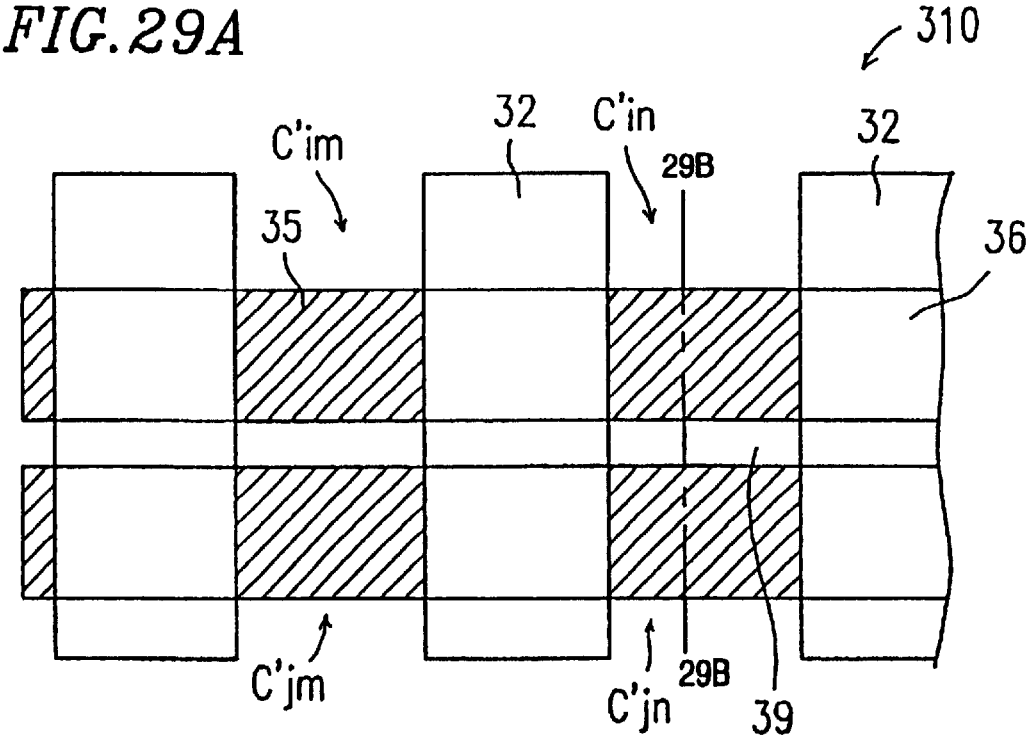
FIG. 29A is a plan view of a portion of a memory cell array of an alternative nonvolatile semiconductor memory according to the present invention, where element isolation is conducted by a p-n joint.
Figure 29B:
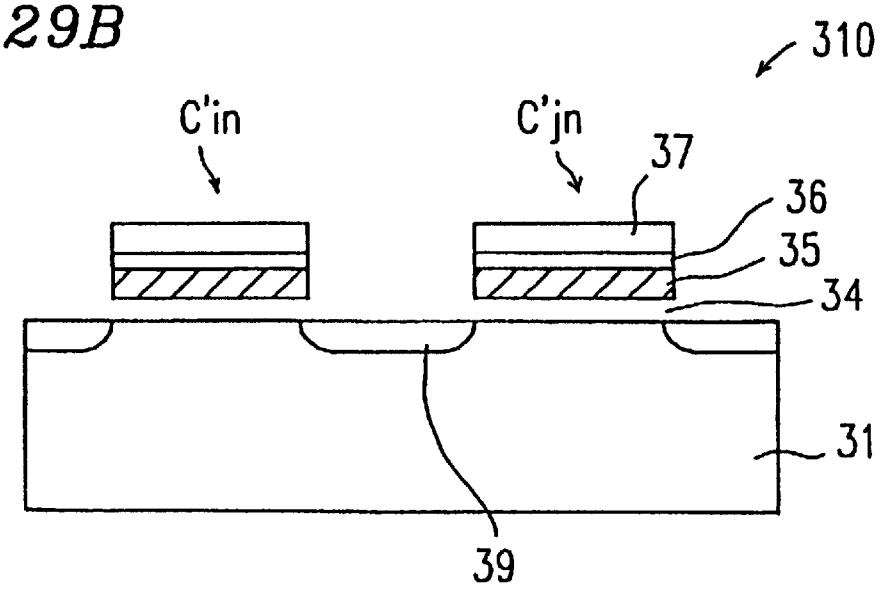
FIG. 29B is a sectional view of the memory cells shown in FIG. 29A taken along line D—D of FIG. 29A.

FIGS. 29A and 29B show an alternative example of the nonvolatile semiconductor memory according to the present invention. A nonvolatile semiconductor memory-310 does not include the field oxide films 42 (see FIG. 15B) on the semiconductor substrate 31. Instead, it includes p-type impurity diffusion layers 39 to isolate memory cells lined in the Y direction from one another.

The fabrication process of the nonvolatile semiconductor memory 310 is almost the same as those described above (see FIGS. 19 to 23, and FIGS. 24 to 28). The p-type impurity diffusion layers 39 are formed by implanting phorone ions under the condition of an energy of 40 KeV and a dose amount of $1\times10^{13}/cm^2$ using the control gates (word lines) 37 as the mask after the formation of the control gates (word lines) 37 (FIG. 29B).

(EXAMPLE 5)

In Example 5, a nonvolatile semiconductor memory 320 using asymmetric transistors where the insulating film is formed asymmetrically between the drain side and the source side, as the nonvolatile semiconductor memory 300 of Example 3, will be described.

Figure 30:
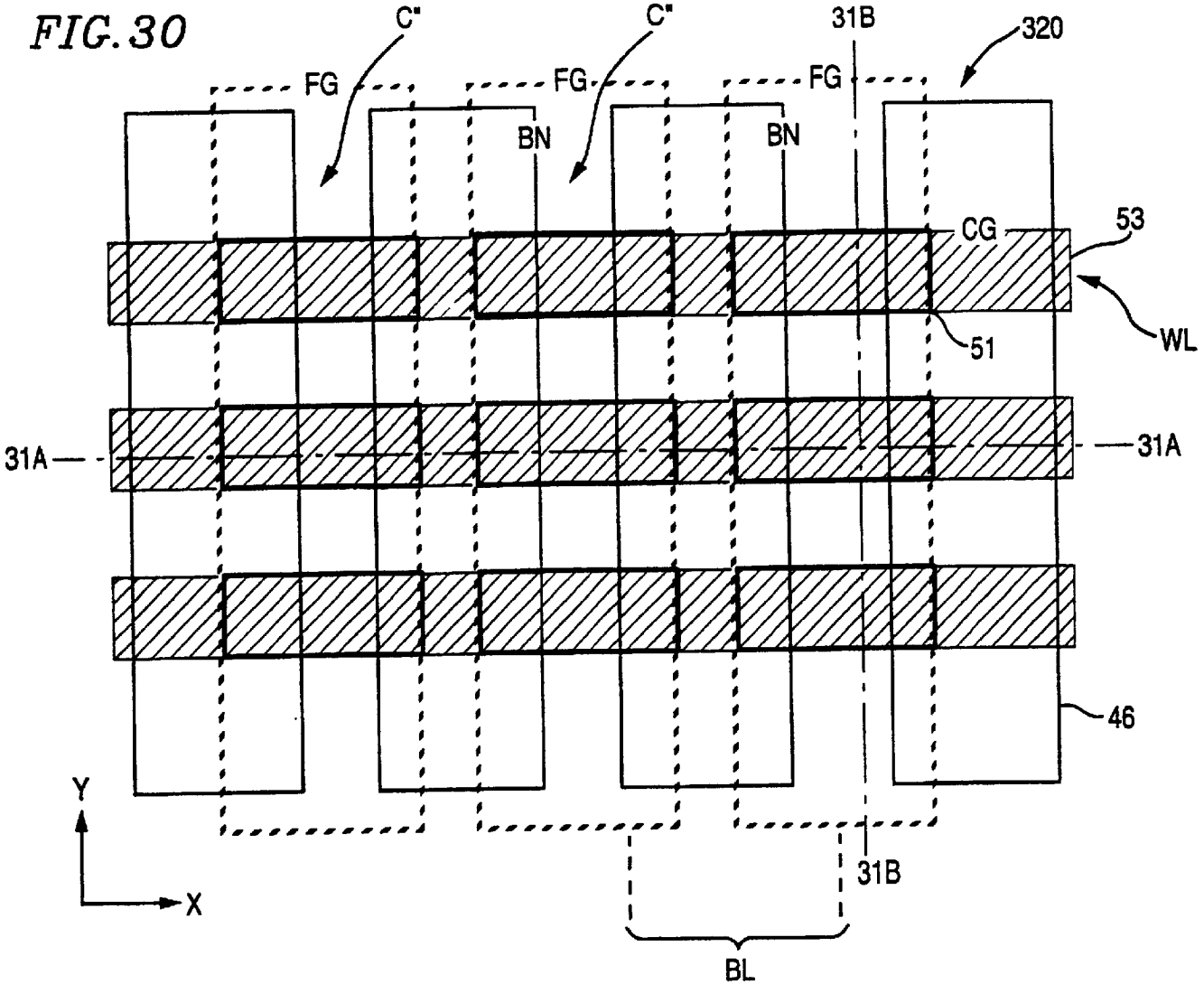
FIG. 30 is a plan view of a portion of a memory cell array of a nonvolatile semiconductor memory of Example 5 according to the present invention.
Figure 31A:
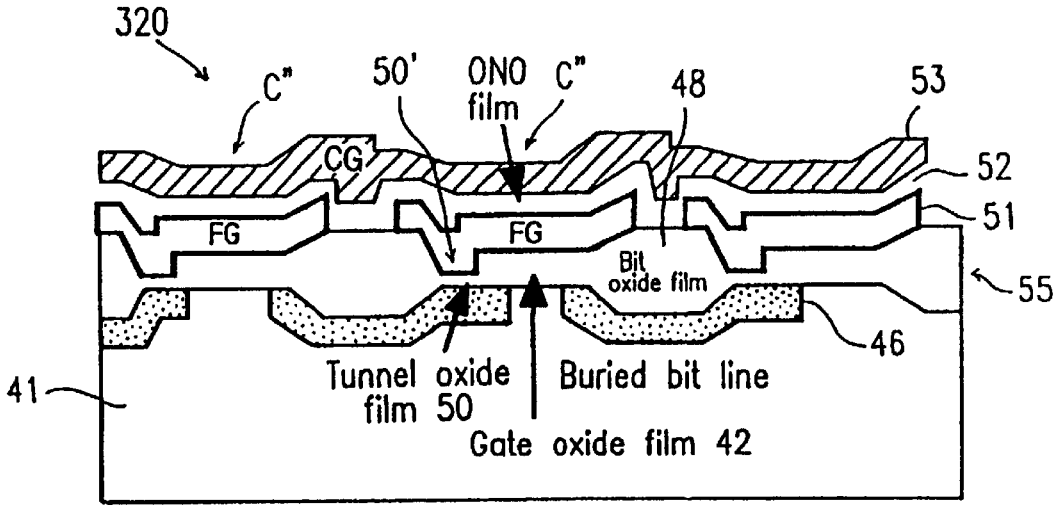
FIGS. 31A and 31B are sectional views of the memory cell array illustrated in FIG. 30 taken along lines A—A and B—B of FIG. 30, respectively.
Figure 31B:
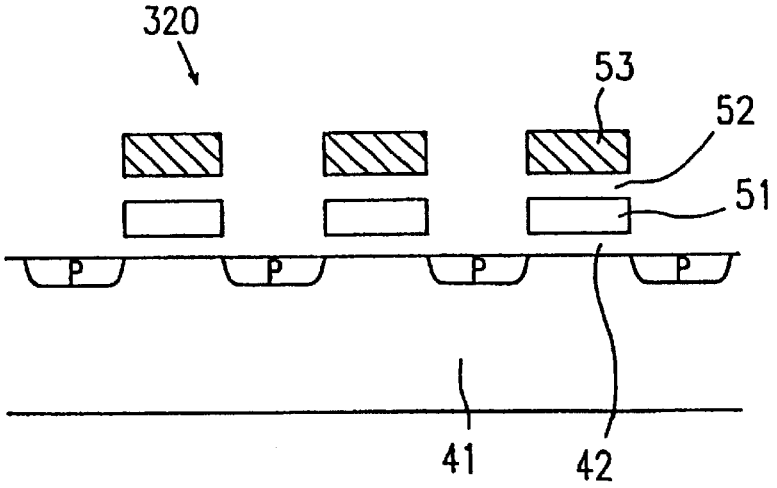

FIG. 30 is a plan view of a portion of a memory cell array of the nonvolatile semiconductor memory 320 of this example according to the present invention. FIGS. 31A and 31B are sectional views of the nonvolatile semiconductor memory 320 taken along lines A—A and B—B of FIG. 30, respectively, Referring t o FIGS. 30, 31A, and 31B, the nonvolatile semiconductor memory 320 includes a plurality of memory cells C" formed in a matrix on a semiconductor substrate 41. In each memory cell C", a floating gate 51 is formed on the semiconductor substrate 41 via an insulating film 55. As shown in FIG. 31A, the insulating film 55 is not uniform in thickness, including a gate insulating film (first gate insulating film) 42, a tunnel insulating film (second gate insulating film) 50, and a bit line insulating film 48 of different thicknesses.

A control gate 53 is formed on the floating gate 51 via an insulating film 52 made of ONO and the like. Such control gates 53 extend in a channel direction of the memory cell C" (an X direction shown in FIG. 30), constituting a word line WL for connecting the memory cells C" lined in the X direction.

As shown in FIGS. 30 and 31A, a high-density n-type diffusion layer 46 is formed between two memory cells adjacent in the X direction. The diffusion layer 46 includes a drain diffusion. layer for one of the two adjacent memory cells and a source diffusion layer for the other memory cell. The diffusion layer 46 is thus shared by the two adjacent memory cells. The diffusion layers 46 lined in the Y direction are connected via diffusion layer wirings, forming a buried bit line.

The gate insulating film 42 and the tunnel insulating film 50 are formed underneath the floating gate 51. All the tunnel insulating films 50 are formed above the diffusion layers 46. Each of the diffusion layers 46 is capacitively coupled with the floating gate 51 of one of the adjacent memory cells via the tunnel insulating film 50 on the drain side (defining a tunnel region 50), while it is capacitively coupled with the floating gate 51 of the other memory cell via the gate insulating film 42 on the source side. The tunnel insulating film 50 is thinner than the gate insulating film 42. Thus, when a predetermined voltage is applied between the floating gate 51 and the semiconductor substrate 41, a tunnel current flows through the tunnel insulating film 50, white it does not flow through the gate insulating film 42.

Thus, the transistor of the memory cell C" in this example is an asymmetric transistor where the insulating film is formed asymmetrically between the drain side and the source side. The tunnel insulating film 50 may be composed of a silicon oxide film or a lamination of a silicon oxide film and a silicon nitride film. The bit line insulating films 48 with a comparatively large thickness are formed above the portions of the diffusion layers 46 other than the drain and source diffusion layers (i.e., in the regions located between adjacent memory cells).

The nonvolatile semiconductor memory 320 employs the virtual ground method, where the bit lines BL serve as the source wirings or the drain wirings depending on the selected cell.

The fabrication method of the nonvolatile semiconductor memory 320 will now be described with reference to FIGS. 32 to 38.

Figure 32:
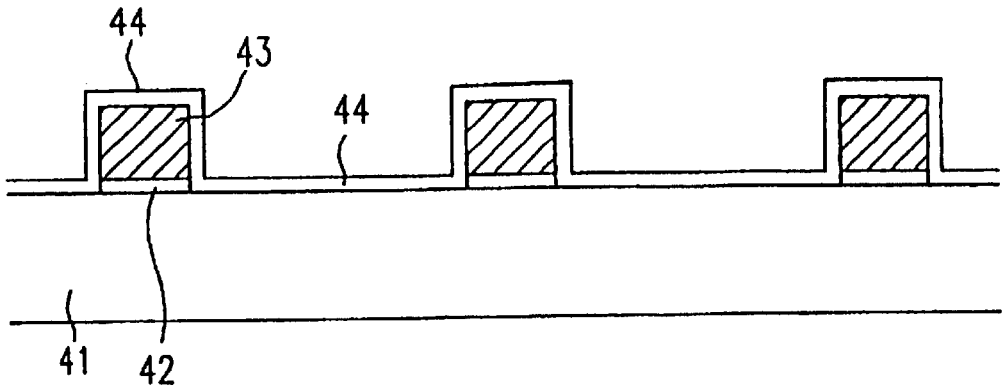
FIG. 32 is a sectional view illustrating a step of a fabrication method of memory cells of the nonvolatile semiconductor memory of Example 5 according to the present invention.

First, the gate insulating film 42 with a thickness of about 40 nm, for example, is formed on the semiconductor substrate (silicon substrate) 41. Then, a first silicon nitride film 43 of a thickness of about 100 nm, for example) is formed on the gate insulating film 42 and patterned into a predetermined stripe shape. The first silicon nitride film 43 serves as a substantial mask for forming the buried bit lines (diffusion layers). After the patterning of the silicon nitride films 43, an oxide film 44 with a thickness of about 40 nm, for example, is formed over the semiconductor substrate 41 (FIG. 32).

Figure 33:
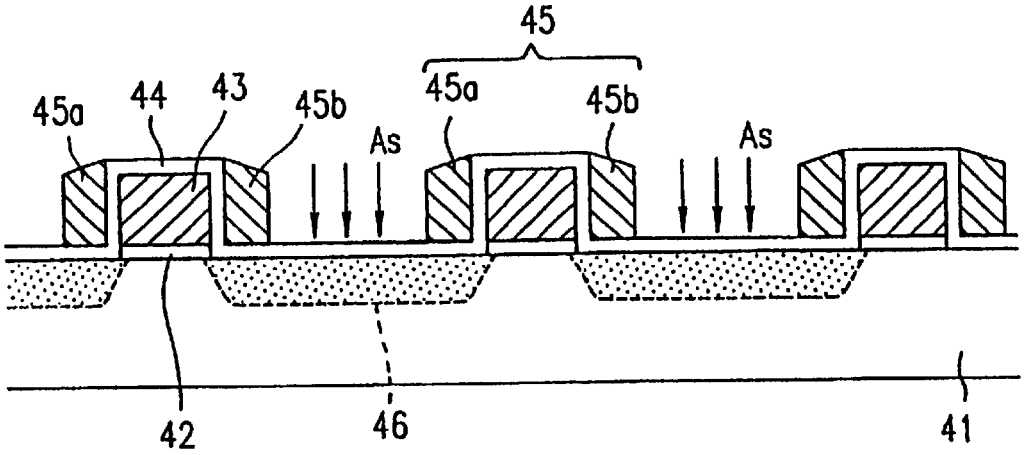
FIG. 33 is a sectional view illustrating a step of the fabrication method of the memory cells of the nonvolatile semiconductor memory of Example 5 according to the present invention.

A second silicon nitride film 45 is formed on the oxide film 44 and etched back to form nitride film spacers 45 on both side walls of each of the first silicon nitride films 43 covered with the oxide film 44. Each of the nitride film spacers 45 is composed of a nitride film spacer 45a corresponding to the drain side (tunnel region) and a nitride film spacer 45b corresponding to the source side. Using the first silicon nitride films 43 and the nitride film spacers 45 as the mask, arsenic ions are implanted, forming the high-density N-type impurity diffusion layers 46 by heat treatment (i.e., the bit lines BL) (FIG. 33).

Figure 34:
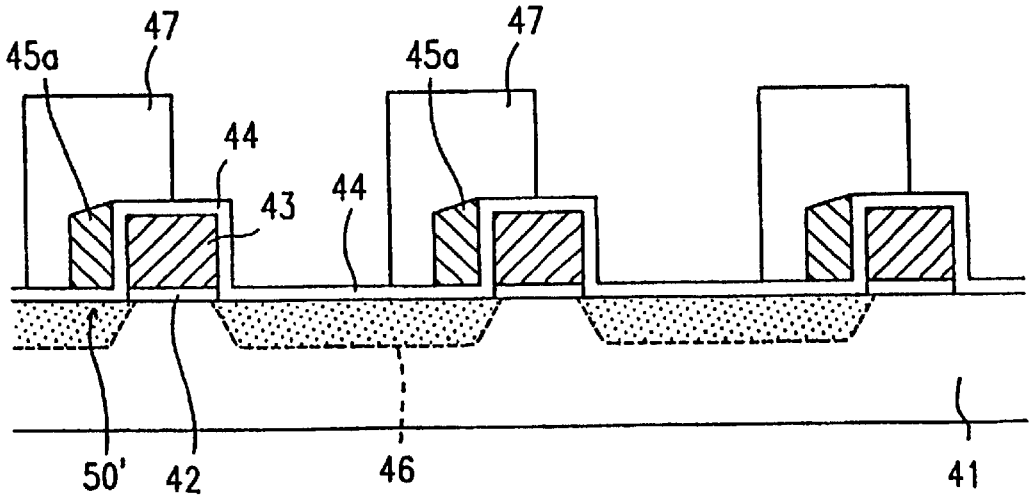
FIG. 34 is a sectional view illustrating a step of the fabrication method of the memory cells of the nonvolatile semiconductor memory of Example 5 according to the present invention.
Figure 35:
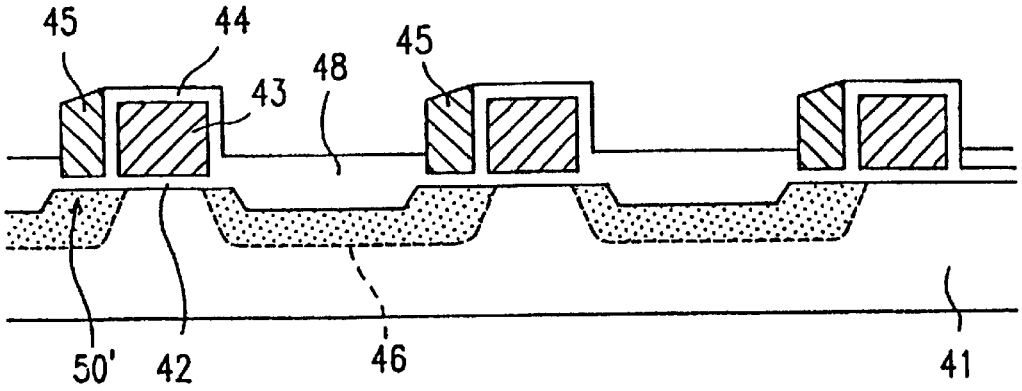
FIG. 35 is a sectional view illustrating a step of the fabrication method of the memory cells of the nonvolatile semiconductor memory of Example 5 according to the present invention.

Thereafter, a resist mask 47 with a predetermined pattern is formed to cover the nitride film spacers 45a corresponding to the tunnel regions 50' to be formed in a later step, and the nitride film spacers 45b are removed by isotropic plasma etching using the resist mask 47 (FIG. 34). Then, the comparatively thick oxide films 48 (thickness: about 150 nm, for example) are formed on the semiconductor substrate 41, covering the diffusion layers 46 (i.e., the bit lines BL) (FIG. 35).

Figure 36:
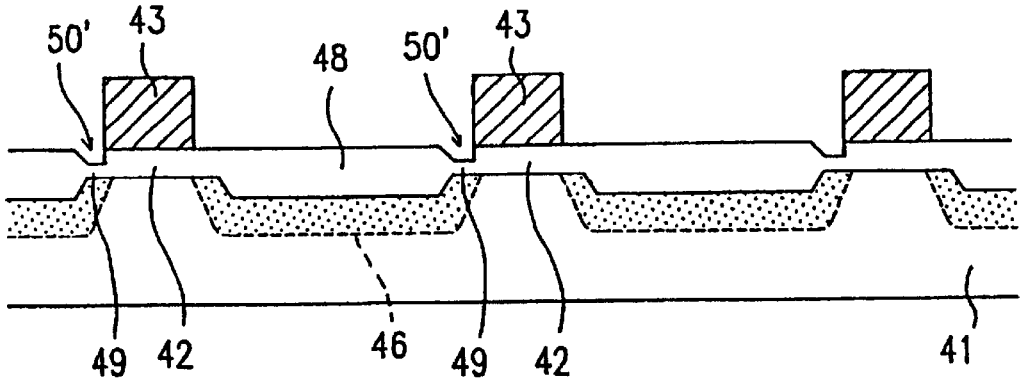
FIG. 36 is a sectional view illustrating a step of the fabrication method of the memory cells of the nonvolatile semiconductor memory of Example 5 according to the present invention.

The nitride film spacers 45a and then the oxide films 44 are removed by etching. The portions of the oxide films 44 located above the tunnel regions 50' are completely removed by removing the thermal oxide films (44 and 48) by the thickness of the oxide films 44 (about 40 nm) by etching. By this etching, since the oxide films 48 are sufficiently thick, the portions of the semiconductor substrate other than the tunnel regions 50' will not be exposed. In a subsequent thermal oxidation step, thin thermal oxide films 49 (thickness: about 10 nm, for example) are formed on the tunnel regions 50' (FIG. 36).

Figure 37:
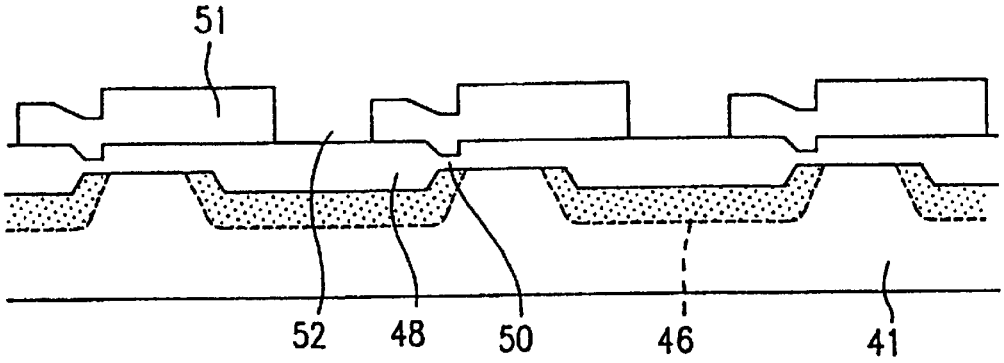
FIG. 37 is a sectional view illustrating a step of the fabrication method of the memory cells of the nonvolatile semiconductor memory of Example 5 according to the present invention.
Figure 38:
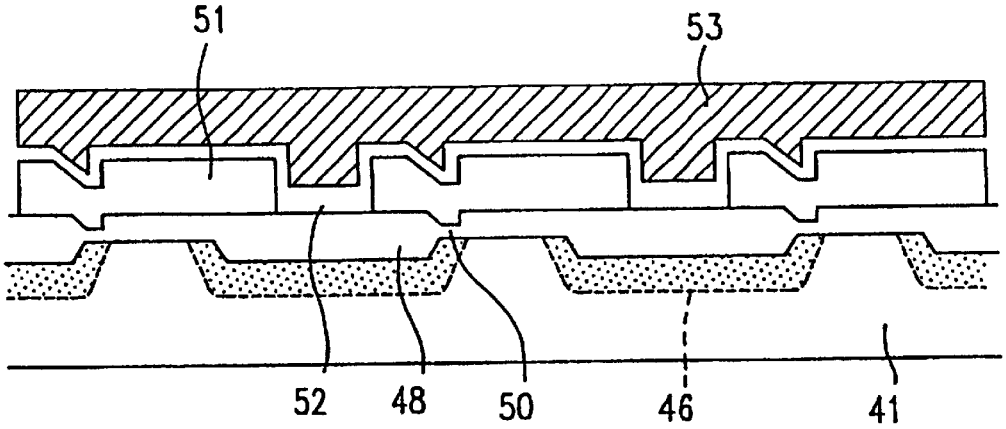
FIG. 38 is a sectional view illustrating a step of the fabrication method of the memory cells of the nonvolatile semiconductor memory of Example 5 according to the present invention.

Thereafter, the first silicon nitride films 43 are completely removed by phosphorous boiling, for example. The oxide films 49 are then removed by etching, to expose only the portion of the semiconductor substrate which is to be the tunnel regions 50'. Then, the tunnel insulating films 50 (thickness: about 8 nm, for example) are formed by thermal oxidation. Subsequently, a first polysilicon film with a thickness of about 1500 Å, for example, is formed on the resultant structure, and patterned into a predetermined shape by photolithography, forming the floating gates 51 (FIG. 37). After the ONO film 52 is formed by CVD, covering the floating gates 51, a second polysilicon film with a thickness of about 1000 Å, for example, is formed on the ONO film 52 and patterned by photolithography, forming the control gates 53 (FIG. 38). The control gates 53 of the respective memory cells are formed consecutively, forming the word line.

The first polysilicon film may be formed in the shape of strips each having the same width as the width in the channel direction of the floating gates 51 and then patterned simultaneously with the second polysilicon film. The control gates 53 may be the word line with the double-layered structure where metal silicide with a high melting point such as tungsten silicide (WSi) is deposited to a thickness of about 100 nm on the second polysilicon layer with a thickness of about 100 nm and these layers are patterned.

Thus, each transistor of this example is an asymmetric transistor having an insulating film including portions with different thicknesses (the gate insulating film 48 and the tunnel insulating film 50) underneath the floating gate 51. In this example, the tunnel region 50' is defined by the nitride film spacer 45a formed on the side walls of the first nitride film 43. This makes it possible to reduce the regions where the tunnel insulating films 50 are formed.

Since all the tunnel regions 50' are formed on the diffusion layers 46, the generation of an interband tunnel current in the write operation can be significantly reduced, improving the write efficiency and the reliability of the memory.

In this example, the capacitance coupling ratio of the control gates increases. This eliminates the necessity of a high voltage transistor module and thus reduces processing costs.

The wiring portions of the diffusion layers 46, i.e., the portions of the diffusion layers 46 other than the source coupling regions and the drain coupling regions (tunnel regions 50') coupled with the floating gates 51 are covered with the comparatively thick insulating films 48. This reduces the parasitic capacitance between the control gates 53 and the bit lines.

(EXAMPLE 6)

Figure 39:
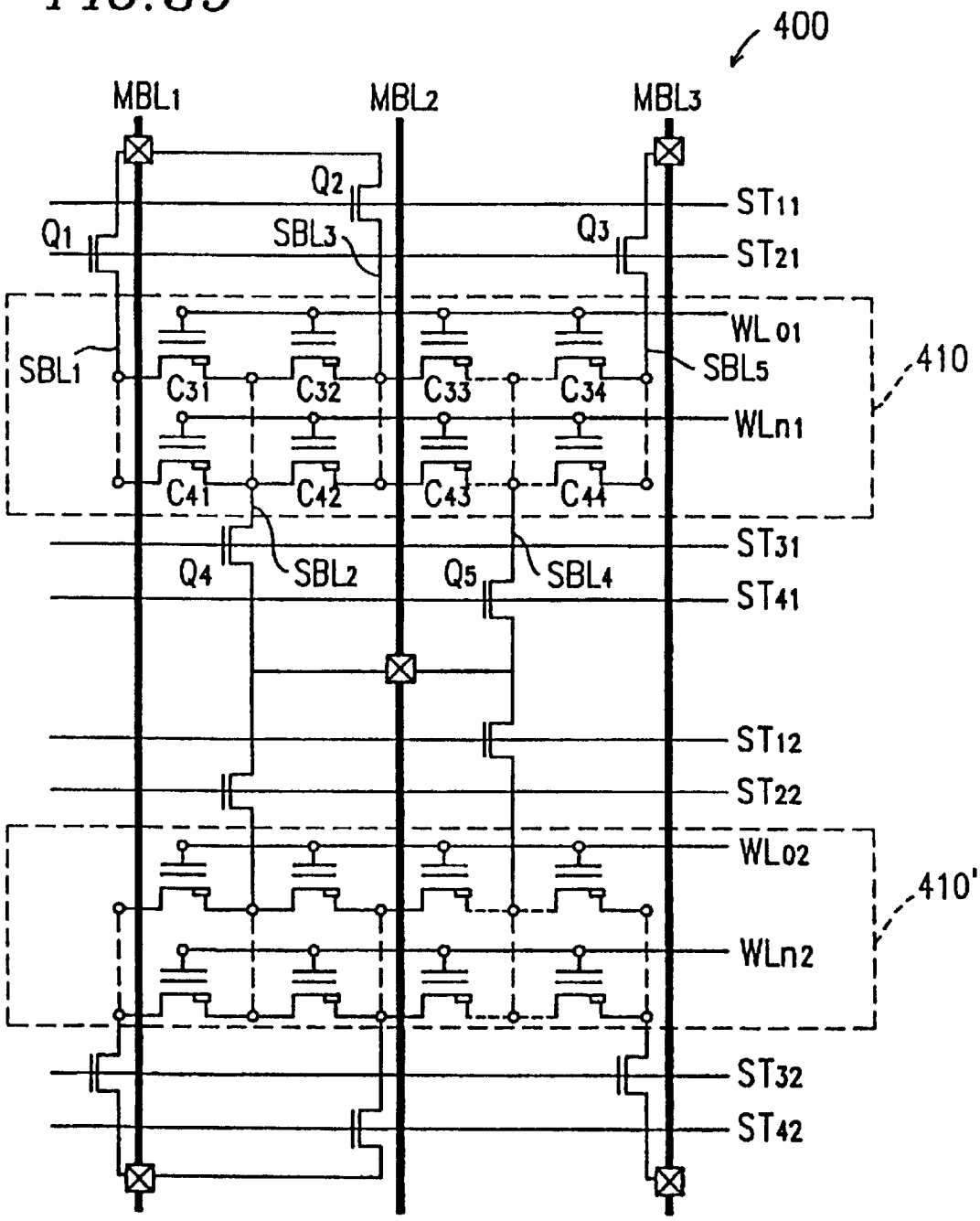
FIG. 39 is a plan view of a portion of a memory cell array of a nonvolatile semiconductor memory of Example 6 according to the present invention.

FIG. 39 is a plan view showing the configuration of a nonvolatile semiconductor memory 400 of Example 6 according to the present invention. A memory cell array of the nonvolatile semiconductor memory 400 is divided into a plurality of blocks 410. This division of the memory cell array into a predetermined number of blocks contributes to reducing the parasitic capacitance and resistance of wirings and increasing the operation speed. In this example, the memory cells C used in the nonvolatile semiconductor memory 100 in Example 1 are used. The configuration of this example can also be applied to the nonvolatile semiconductor memory 300 of Example 3. The operation of such a nonvolatile semiconductor memory obtained by dividing the memory cell array of the nonvolatile semiconductor memory 300 of Example 3 into a plurality of blocks is basically the same as that described hereinbelow. Voltages to be applied may be changed depending on the characteristics of the memory cells.

Referring to FIG. 39, the diffusion layers 2 of the nonvolatile semiconductor memory 400 are coupled in the Y direction, forming sub-bit lines SBL (sub-bit lines $SBL_1$ to $SBL_5$ are shown in FIG. 39). One main bit line MBL is arranged for every two sub-bit lines SBL (main bit lines $MBL_1$ to $MBL_3$ are shown in FIG. 39). The main bit lines MBL are made of a metal layer and arranged in the same direction as the sub-bit lines SBL at a pitch of every two memory cells C. In this example, the submit lines SBL are diffusion layer wirings, while the main bit lines MBL are metal wirings so that the memory cells can be formed irrelevant of the pitch of the metal wirings, the pitch of the metal wirings can be every two memory cells, and thus the parasitic capacitance of the metal wirings can be reduced.

The sub-bit lines SBL are connected to the corresponding main bit lines MBL via selective transistors. For example, the sub-bit lines $SBL_1$ and $SBL_3$ are connected to the main bit line $MBL_1$ via selective transistors $Q_1$ and $Q_2$, respectively, while the sub-bit lines $SBL_2$ and $SBL_4$ are connected to the main bit line $MBL_2$ via selective transistors $Q_4$ and $Q_5$, respectively. The selective transistors are controlled via corresponding selective lines ST (selective lines $ST_{11}$ to $ST_{41}$, and $ST_{12}$ to $ST_{42}$ are shown in FIG. 39).

The block 410 includes a plurality of word lines $WL_{01}$ to $WL_{n1}$ (e.g., when n=31, 32 word lines). Incidentally, the right-side number of the subscript of the word line code (01, n1, etc.) represents the block number. The number is therefore 2 for the word lines in a second block 410' shown in FIG. 39 (word lines $WL_{02}$, $WL_{n2}$, etc.). The configuration of the block 410 and the arrangement of the main bit lines MBL are not limited to those described above.

When the block 410 is a non-selected block in the erase operation, the selective transistors $Q_1$ to $Q_5$ are turned off to electrically isolate all the diffusion layers 2 (sub-bit lines SBL) in the block 410 from the corresponding main bit lines MBL (floating state). This prevents data in the non-selected block from being erased mistakenly even if the erase operation is repeated.

The sub-bit line closest to the boundary of each block is not connected with a memory cell included in the adjacent block.

The operation of the nonvolatile semiconductor memory 400 will now be described. Table 3 shows examples of applied voltages in the respective operation modes when a memory cell $C_{31}$ is selected.

TABLE 3

| Operation | Main bit line voltage (V) | | | Word line voltage (V) | | Selective line voltage (V) | | | | |
|---|---|---|---|---|---|---|---|---|---|---|
| | | | | Selected | Non-selected | Selected | | | | Non-selected |
| mode | MBL1 | MBL2 | MBL3 | WL0 | WL31 | ST11 | ST21 | ST31 | ST41 | STin |
| write | 4 | Float | Float | −8 | 0 | 0 | 6 | 6 | 0 | 0 |
| Erase | 0 | 0 | 0 | 17 | 17 or 0 | 3 | 3 | 3 | 3 | 0 |
| Read | 0 | 1 | 1 | 3 | 0 | 0 | 3 | 3 | 0 | 0 |

In the write operation, a negative high voltage (e.g., −8 V) is applied to the word line $WL_{01}$, while the main bit line $MBL_1$ is put in the floating state, and a predetermined positive voltage (e.g., 4 V) is applied to the main bit line $MBL_2$. The selective line $ST_{21}$ is set at a low level (6 V) to turn on the selective transistor $Q_1$ and thus connect the sub-bit line $SBL_1$ to the main bit line $MBL_1$. Simultaneously, the selective lines $ST_{11}$ and $ST_{41}$ are set at a low level (e.g., 0 V) to turn off the selective transistors $Q_2$ and $Q_5$ and put the sub-bit lines $SBL_3$ and $SBL_4$ in the floating state. As a result, in the selected cell $C_{31}$, a negative high voltage is applied to the control gate 7, 0 V is applied to the source diffusion layer 2b, and a predetermined positive voltage is applied to the drain diffusion layer 2a. This causes a tunnel current to flow into the floating gate 5 (i.e., electrons are drawn out), and thus data to be written in the selected cell $C_{31}$.

At that time, the drain disturb immunity of the memory cells connected with the same sub-bit line $SBL_1$ can be improved by applying a voltage lower than the voltage applied to the drain to the non-selected word lines WL in the same block.

The erase operation is conducted for every sector or every block. The voltage of 0 V is applied to the main bit lines $MBL_1$, $MBL_2$, and $MBL_3$ and a positive high voltage (e.g., 17 V) is applied to a predetermined word lie e.g., the word line $WL_{01}$, while 0 V is applied to the other word lines $WL_{n1}$. Data of the memory cells connected with the word line WL to which the positive high voltage has been applied are erased, while data of the memory cells connected with the word lines WL to which 0 V is applied are not erased, by setting the selective lines $ST_{11}$, $ST_{21}$, $ST_{31}$, and $ST_{41}$3 at a high level (e.g., 3 V) and turning all the selective transistors in the block where the memory cells to be erased are included. Accordingly, when sector-unit erasing is conducted, a positive high voltage is applied to only one word line, while 0 V is applied to the other word lines.

When block-unit erasing is conducted, data in all the memory cells in the block 410 are erased at one time by applying a high voltage to all the word lines in the block 410 simultaneously.

The read operation for the selected cell $C_{31}$ is conducted in the following manner. A predetermined positive voltage (e.g., 1 V) is applied to the main bit line $MBL_2$, while a positive voltage (e.g., 3 V) is applied to the word line $WL_{01}$. The selective lines $ST_{21}$ and $ST_{31}$ are set at a high level (e.g., 3 V) to turn on the selective transistors $Q_1$ and $Q_4$. No "soft write" phenomenon occurs in the memory cells by reading data from the low-density source diffusion layer side.

At this time, the selective transistor $Q_3$ is turned on simultaneously, allowing the sub-bit line $SBL_5$ to be connected to the main bit line $MBL_3$. FIG. 40 shows how the memory cells connect with the word line $WL_{01}$. Referring to FIG. 40, in the read operation for a selected memory cell (A in FIG. 40), when a positive voltage is applied to the word line $W_{01}$, the drain diffusion layer (sub-bit line $SBL_1$) is connected to the main bit line $MBL_1$ (ground level) via the selective transistor $Q_1$, the source diffusion layer (sub-bit line $SBL_2$) is connected to the main bit line $MBL_2$ (1 V) via the selective transistor $Q_4$, and the sub-bit line $SBL_5$ is connected to the main bit line $MBL_3$ via the selective transistor $Q_3$. At this time, the memory cell transistor is turned on or off depending on whether data stored in the memory cell $C_{31}$ is 1 or 0. When the memory cell transistor is off, correct reading of data may not be possible due to the lowering of the potential at the main bit line $MBL_2$ (sub-bit line $SBL_2$). To avoid this occurrence, the same potential is applied to the main bit line $MBL_3$ (sub-bit line $SBL_5$). The sub-bit lines $SBL_3$ and $SBL_4$ are in the floating state and the parasitic capacitance in the sub-bit lines is small compared with the main bit lines. The influence of the sub-bit lines is therefore small. When the memory cell transistor is on, the leakage current flowing from the memory cell $C_{32}$ through the memory cell $C_{34}$ is negligible compared with the current flowing to the memory cell $C_{31}$, even if the same voltage has been applied to the main bit line $MBL_3$ (sub-bit line $SBL_5$), causing no trouble for reading.

In FIG. 40, the capacitance of the main bit line is denoted as $C_{MBL}$.

When data is read from the memory cell A connected with the word line $WL_{o1}$, the leakage current flowing along the word line $WL_{n1}$ from the sub-bit line $SBL_2$ to the sub-bit line $SBL_1$ adjacent each other in the Y direction is negligible compared with the channel current of the memory cell A in which the data has been written, as shown in FIG. 41. As is observed from FIG. 41, when the threshold voltage of the memory cell is more than 0.5 V, the leakage current of the non-selected memory cell of which control gate is grounded is smaller than the read current by seven digits, which is therefore negligible.

Now, an alternative example of the driving method of the nonvolatile semiconductor memory 400 will be described. In the above driving method, a high voltage (17 V) is applied to the word line in the erase operation. However, the high voltage applied to the word line can be reduced by applying a negative voltage to the diffusion layer 2 and the semiconductor substrate 1 in the erase operation.

According to this alternative driving method, in the erase operation, the selective transistors in a nonselected block are turned off, to put the diffusion layers 2 (i.e., the sub-bit lines SBL) of the non-selected block in the floating state. When a negative voltage is applied to the semiconductor substrate 1, the selective transistors Q are turned on or off depending on the high level (0 V) or the low level (negative voltage, e.g., −8 V) of the selective lines. Specifically, as shown in FIGS. 39 and 42, the selective lines $ST_{n1}$ (n=1 to 4) of the selected block 410 are set at 0 V and the selective lines $ST_{n2}$ (n=1 to 4) of the non-selected block 410' are set at a low level (−8 V).

Figure 42:
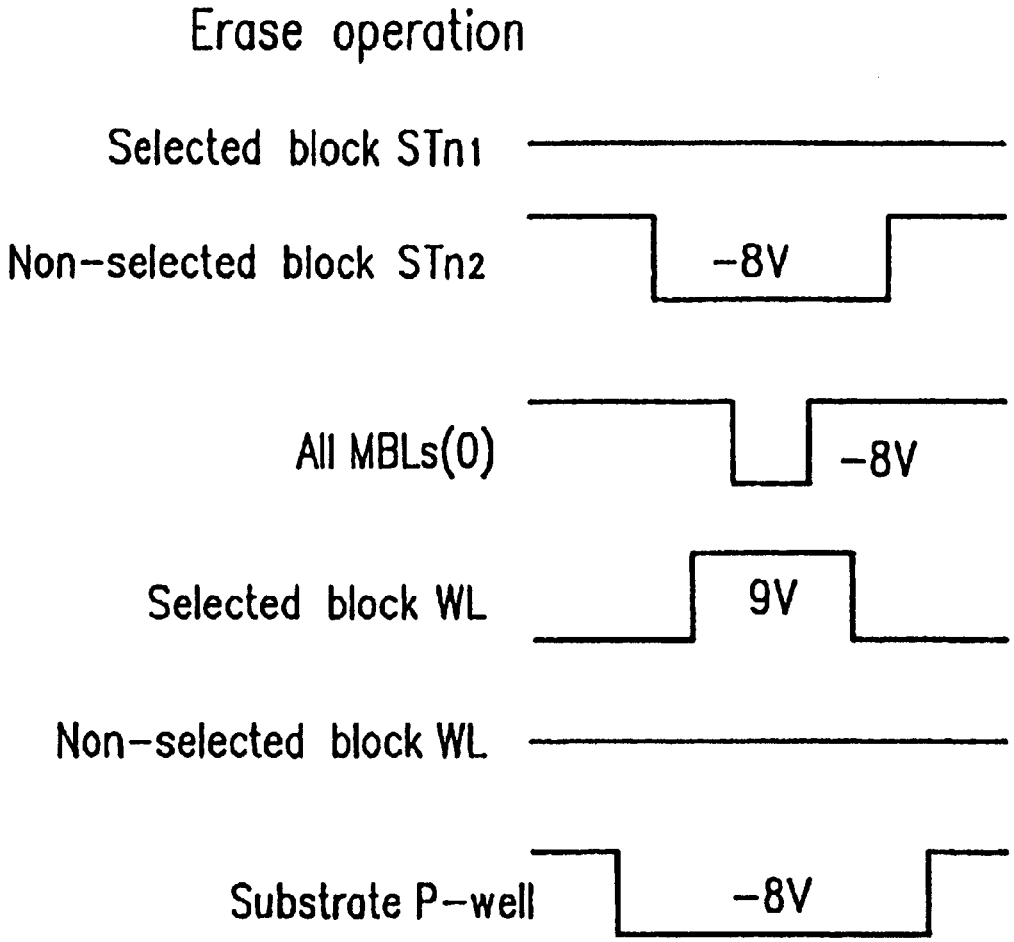
FIG. 42 is a timing chart schematically showing the applied voltages in the erase operation.

As shown in FIG. 42, a negative voltage (e.g., −8 V) is applied to the semiconductor substrate 1, while a positive voltage (e.g., 9 V) is applied to the word lines WL (i.e., the control gates 7) and a negative voltage (e.g., −8 V) is applied to the diffusion layers 2 (main bit lines MBL) in the selected block 410. As a result, all data in the selected block 410 are erased.

Figure 43:
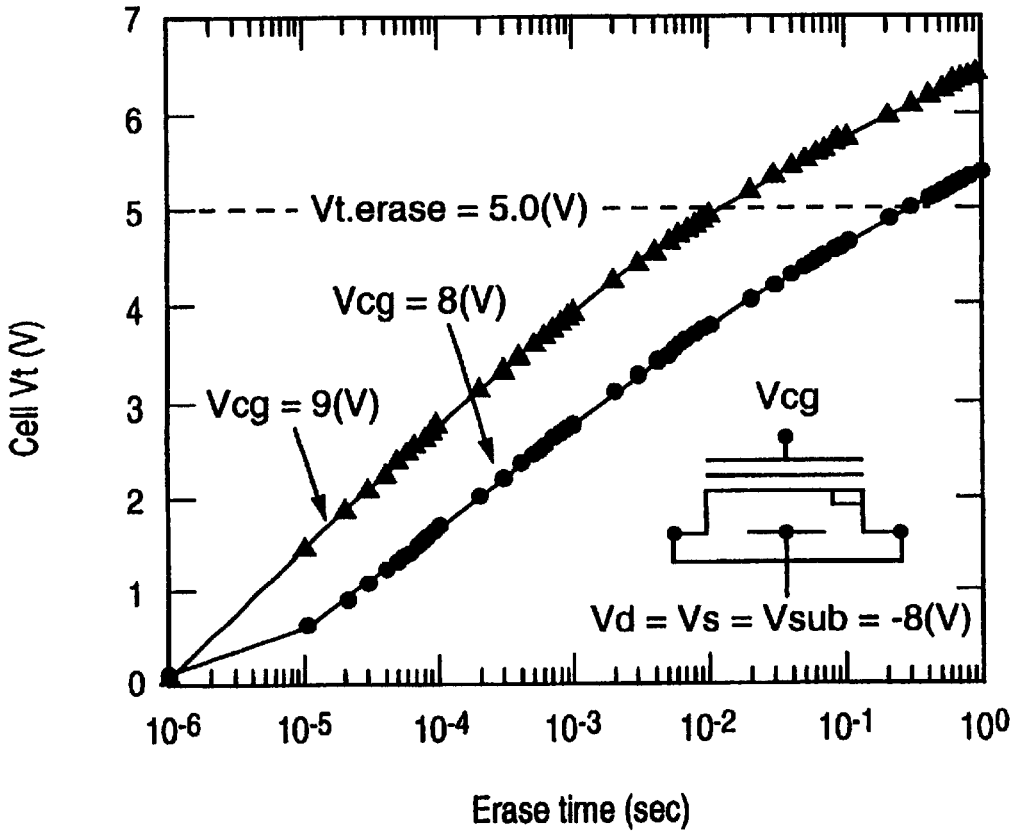
FIG. 43 shows the relationship between the voltage application time to a control gate and the threshold voltage of a memory cell when a negative voltage is applied to a source/drain diffusion layer and a semiconductor substrate.

FIG. 43 shows the time required to erase data in a memory cell (erase time) when voltages of 8 V and 9 V are applied to the control gate 7. As is observed from FIG. 43, assuming that the threshold voltage of the memory cell in the erase state is 5 V, when a voltage of 9 V is applied to the control gate 7, data in the memory cell is erased in about $10^{-2}$ seconds.

The memory cell array is formed on a well which is formed in the semiconductor substrate. When a negative voltage is applied to the well, it is necessary to isolate the well for each block to prevent the negative voltage from being applied to other non-selected blocks formed on the same substrate. Isolating the well for every block results in increasing the size of the memory. In practice, however, no problem will occur in the aspect of reliability of the memory cells if the well is not isolated for every block, due to the following reasons.

Figure 44:
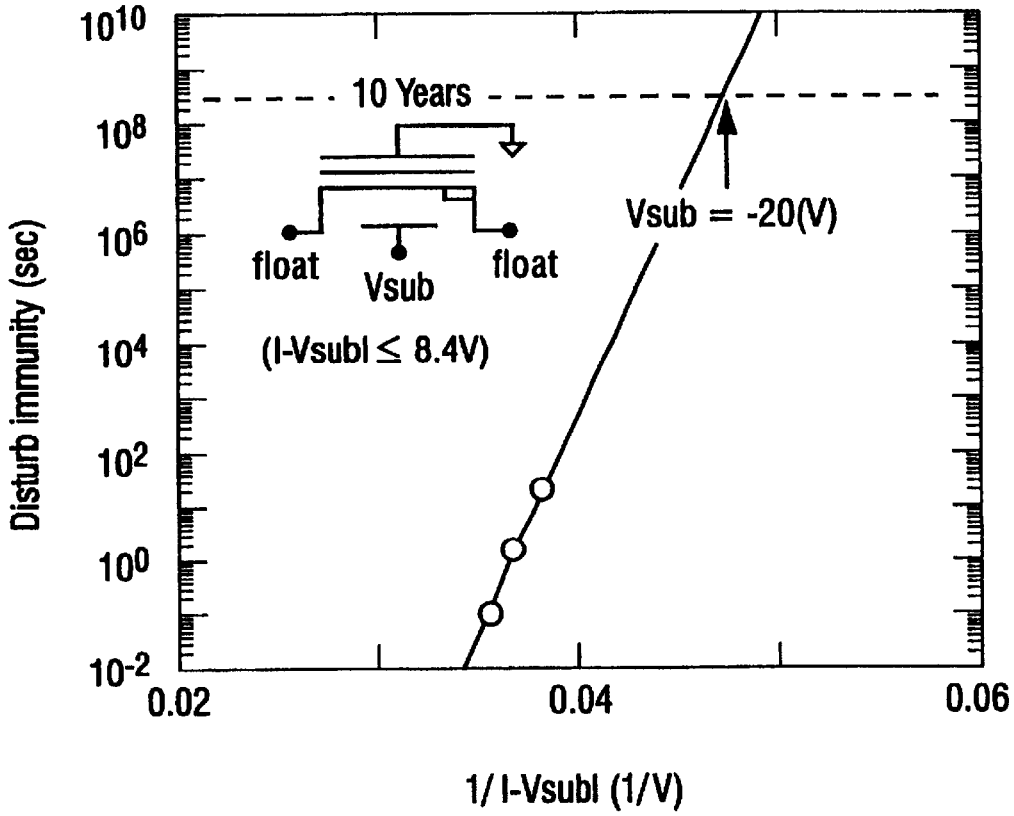
FIG. 44 shows the relationship between the negative voltage applied to the semiconductor substrate and the life of the memory cell (reliability).

FIG. 44 shows the relationship between the negative voltage ($-V_{sub}$) applied to the semiconductor substrate and the reliability (disturb immunity) of the tunnel insulating film (thickness: about 80 Å). As is observed from FIG. 44, when the tunnel insulating film with a thickness of about 80 Å is formed, the nonvolatile semiconductor memory has a life of 10 years or longer as long as the voltage applied to the substrate does not exceed −20 V.

Another example of the write operation will be described. In writing data in each memory cell, as described above, only the selective transistors connected with the selected block 410 are turned on. Then, while a negative voltage (e.g., −8V) is applied to the word line WL (i.e., the control gate 7) connected with the selected call in which data is to be written, a voltage corresponding to the data is applied to the sub-bit line SBL connected with the drain diffusion layer 2a of the selected cell.

In this example, two sub-bit lines SBL are connected to one main bit line MBL via respective selective transistors. In the nonvolatile semiconductor memory 400, the main bit line MBL is selected in the following manner so that data can be written in the corresponding memory cell. Hereinbelow, the case where the main bit line $MBL_2$ is selected as the drain wiring will be described with reference to Table 4 below and FIG. 45.

TABLE 4

| Operation mode | Main bit line voltage (V) | | | Word line voltage (V) | | Selective line voltage (V) | | | | |
|---|---|---|---|---|---|---|---|---|---|---|
| | | | | Selected | Non-selected | Selected | | | | Non-selected |
| | MBL1 | MBL2 | MBL3 | WLol | WLal | ST11 | ST21 | ST31 | ST41 | STin |
| Write | 4/Float | 4/Float | 4/Float | −8 | 0 | 0 | 6 | 6 | 0 | 0 |
| | 4/Float | 4/Float | 4/Float | −8 | 0 | 6 | 0 | 0 | 6 | 0 |

Figure 45:
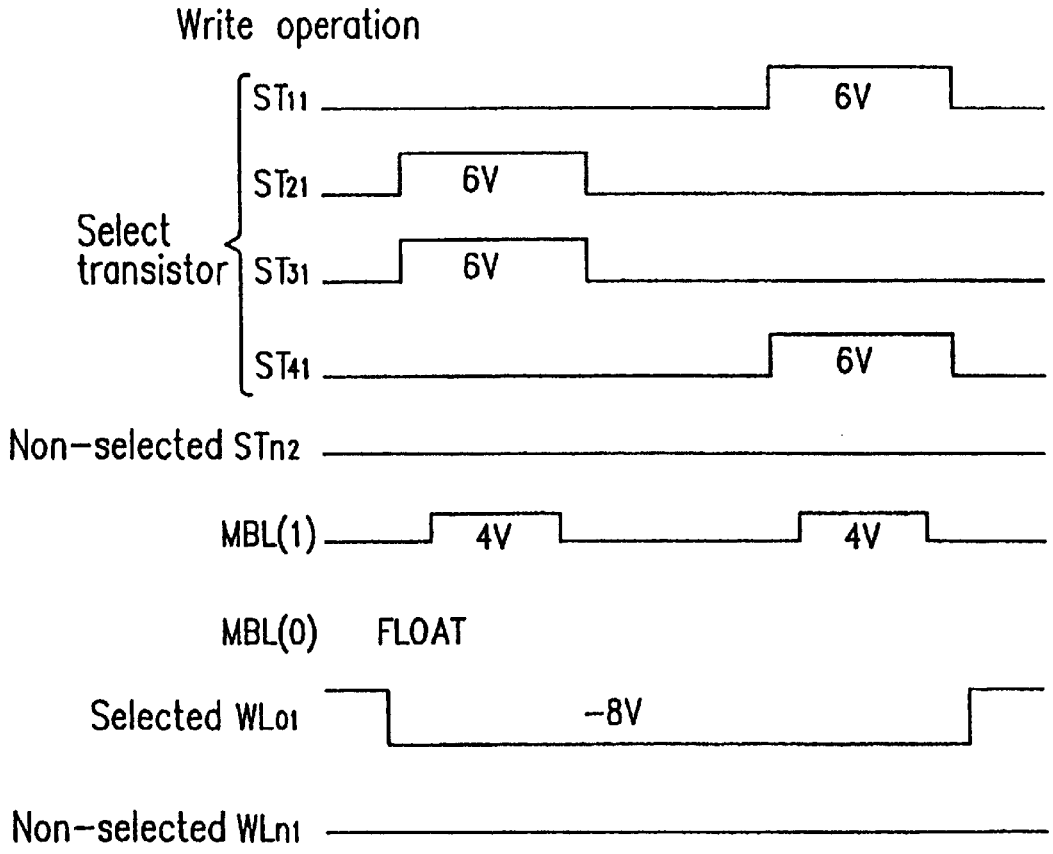
FIG. 45 is a timing chart schematically showing the applied voltages in the write operation.

Referring to Table 4 and FIG. 45, a negative write voltage (−8 V) is applied to the selected word line $WL_{o1}$. The, ground voltage (0 V) is retained for the non-selected word lines $WL_{n1}$ ($n \neq 0$). Then, the selective lines $ST_{21}$ and $ST_{31}$ are set at a high level (6 V), the sub-bit line $SBL_1$ is connected to the main bit line $MBL_1$ via the selective transistor $Q_1$, the sub-bit line $SBL_2$ is connected to the main bit line $MBL_2$ via the selective transistor $Q_4$, and the sub-bit line $SBL_3$ is connected to the main bit line $MBL_3$ via the selective transistor $Q_3$. Under this state, a write voltage is applied to the main bit line MBL depending on the data to be stored in the memory cell C in which the data is to be written. For example, 4 V is applied as the write voltage for data 1 to allow a tunnel current to flow, while the floating state is established for data 0 to inhibit writing. Thus, data are written in the memory cells $C_{31}$, $C_{32}$,$C_{35}$ (not shown), etc. The selective lines for the other nonselected selective transistors are retained grounded.

While the negative write voltage (−8 V) is kept applied to the selective word line $WL_{o1}$, the selective lines $ST_{21}$, and $ST_{31}$, are set at a low level (0 V), and then the selective lines $ST_{11}$ and $ST_{41}$ are set at a high level (5 V). The sub-bit line $SBL_3$ is connected to the main bit line MBL, via the selective transistor $Q_2$, and the sub-bit line $SBL_4$ is connected to the main bit line $MBL_2$ via the selective transistor $Q_5$. Likewise, a write voltage corresponding to the memory cell C to be selected next is applied to each main bit line MBL (4 V for data 1, while the floating state is established for data 0). Thus, data are written in the memory cells $C_{33}$ and $C_{34}$. By these two write operations, writing to the memory cells connected with the word line $WL_{01}$ is completed. After the writing, the potential at the word line $WL_{o1}$ is returned to the ground voltage (0 V).

In this example, two sub-bit lines SBL are connected to one main bit line MBL. However, an arbitrary number (N) of sub-bit lines SBL may be connected to the main bit line MBL via corresponding selective transistors. In this case, when one word line WL is selected, data can be written in all memory cells corresponding to the N sub-bit lines SBL connected to one main bit line MBL by N-time repetition of the write operation.

Figure 46:
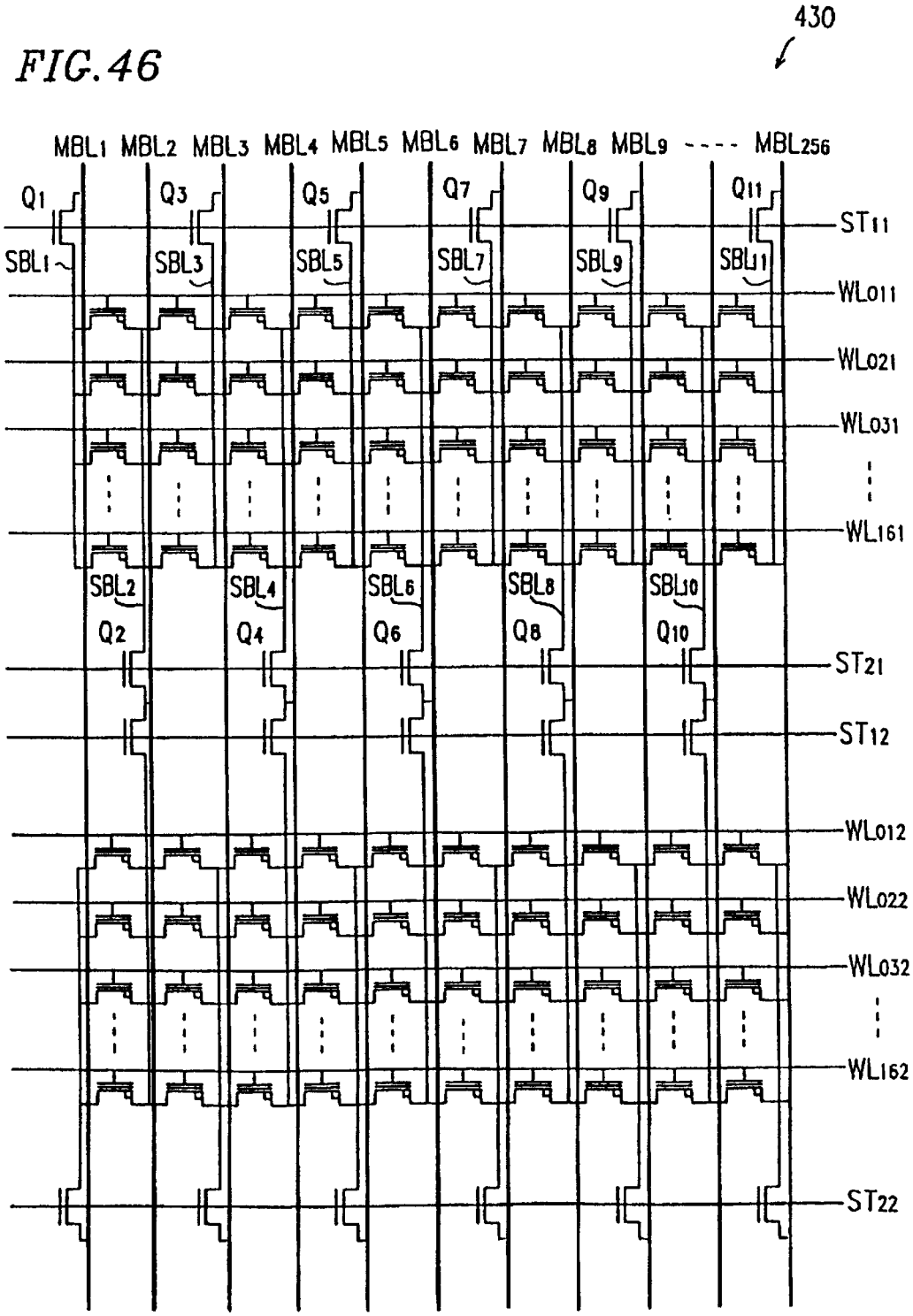
FIG. 46 ia a plan view of an alternative example of the memory cell array of the nonvolatile semiconductor memory according to the present invention.
Figure 47:
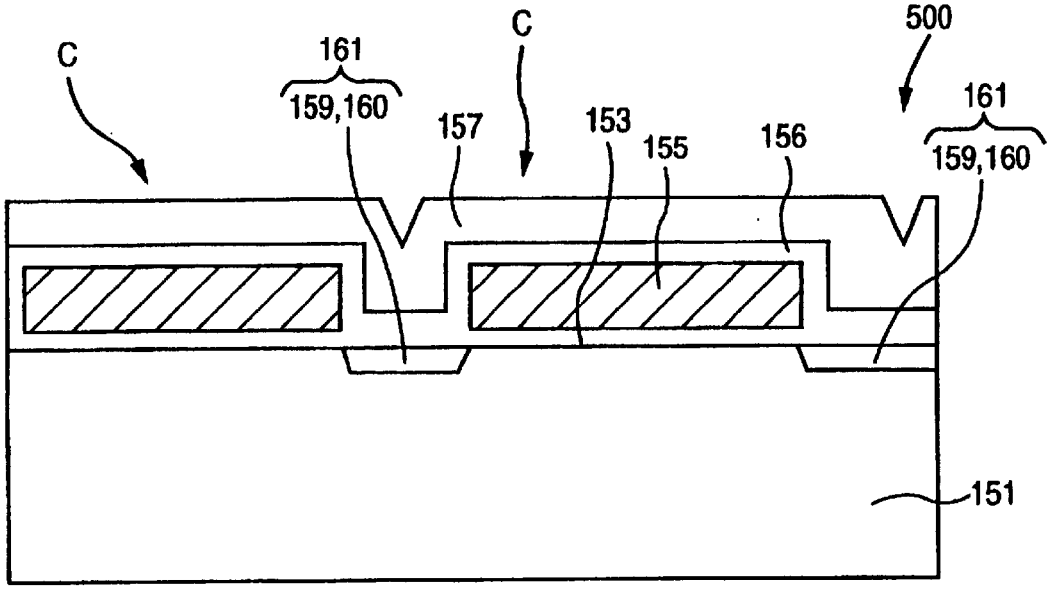
FIG. 47 PRIOR ART
FIG. 47 is a sectional view of a portion of a memory cell array of a conventional nonvolatile semiconductor memory of the type of using hot electron injection for writing.
Figure 48:
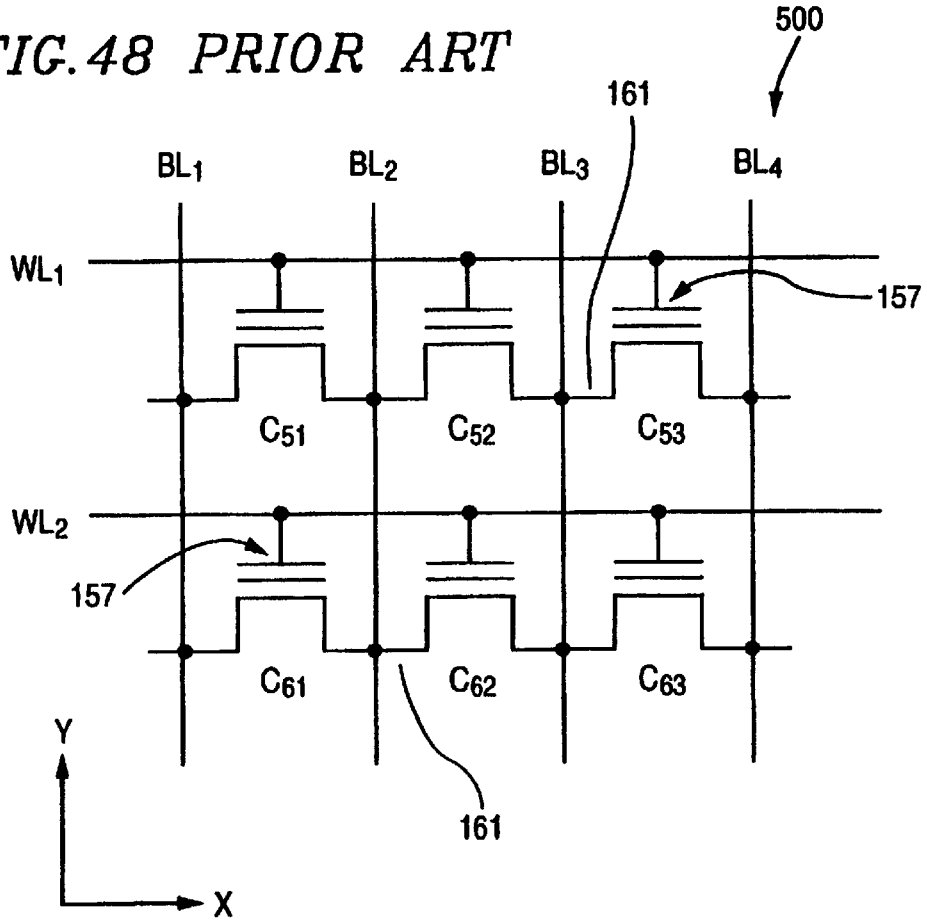
FIG. 48 PRIOR ART
FIG. 48 is an equivalent circuit diagram of the memory cell array of the nonvolatile semiconductor memory illustrated in FIG. 47.
Figure 49:
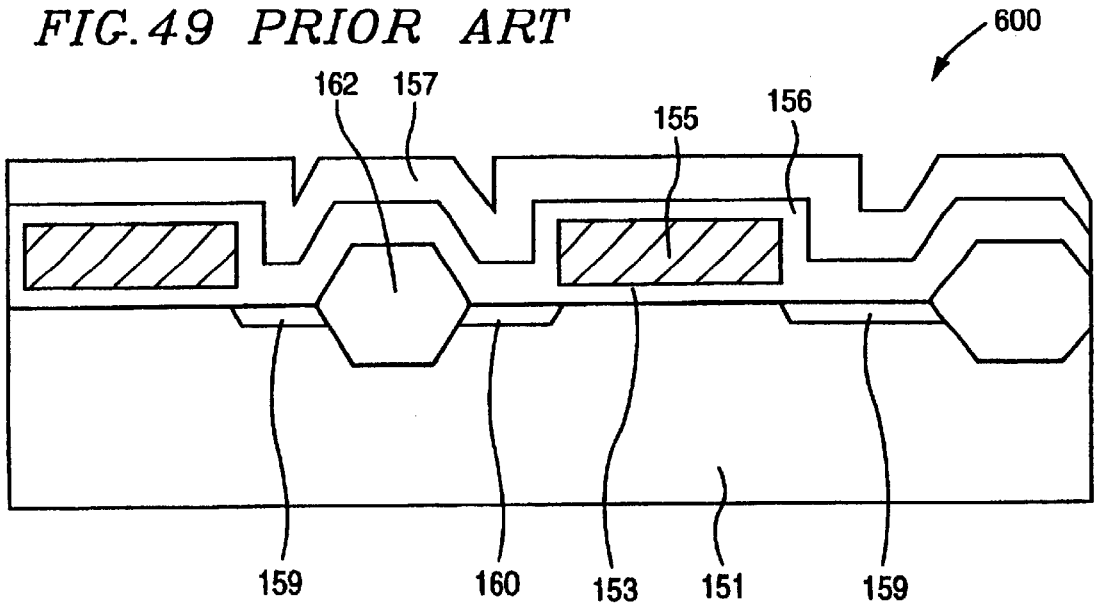
FIG. 49 PRIOR ART
FIG. 49 is a sectional view of a portion of a memory cell array of a conventional nonvolatile semiconductor memory of the type of using an FN tunnel current for writing.
Figure 50:
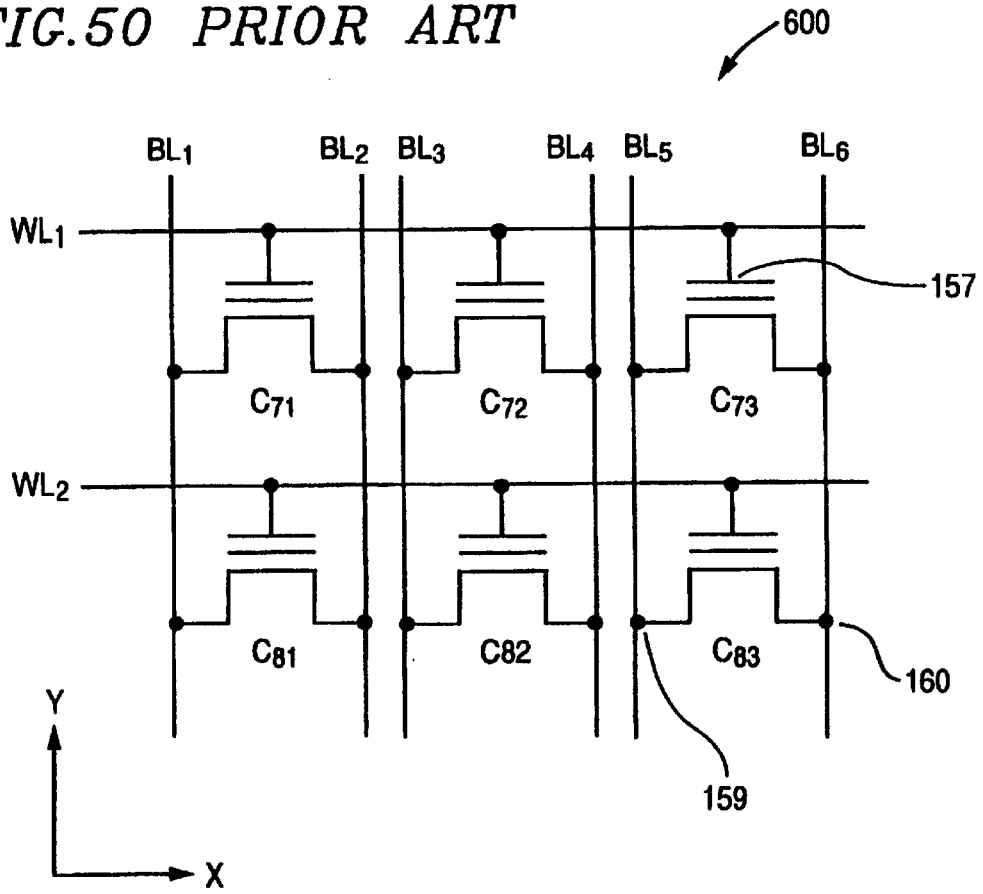
FIG. 50 PRIOR ART
FIG. 50 is an equivalent circuit diagram of the memory cell array of the nonvolatile semiconductor memory illustrated in FIG. 49.
Figure 51:
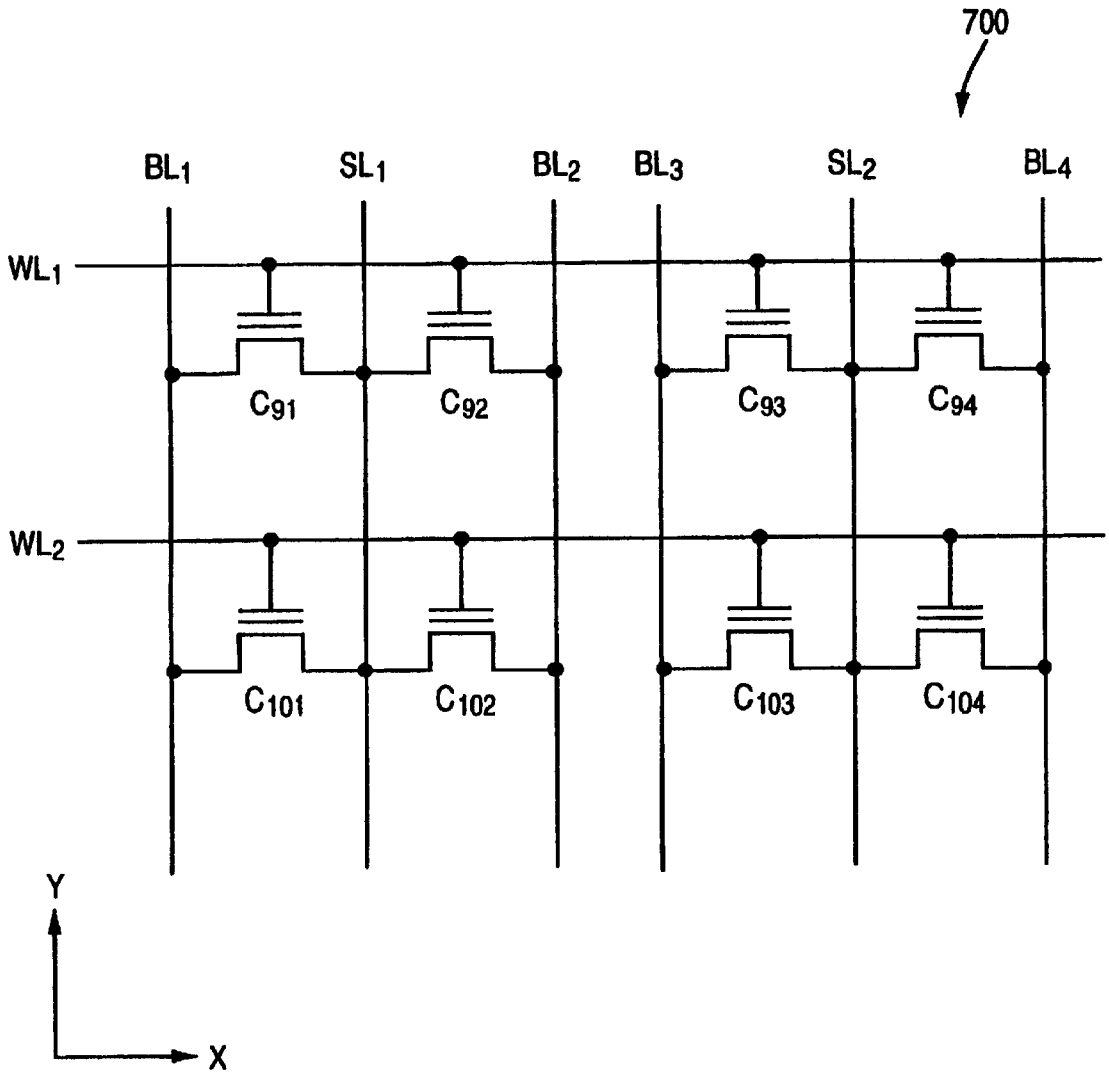
FIG.51 PRIOR ART
FIG. 51 is an equivalent circuit diagram of a portion of a memory cell array of another conventional semiconductor memory of the type of using an FN tunnel current for writing.

FIG. 46 shows an alternative example of a nonvolatile semiconductor memory 430 where only one sub-bit line SBL is connected to each main bit line MBL via the corresponding transistor Q (N=1). Referring to FIG. 46, the sub-bit line $SBL_1$, for example, is connected to the main bit line $MBL_1$ via the selective transistor $Q_1$. The sub-bit lines $SBL_1$, $SBL_2$, . . . are electrically isolated from the main bit lines $MBL_1$, $MBL_2$, . . . and put in the floating state by turning off the selective transistors $Q_1$, $Q_2$, . . . , respectively.

In the nonvolatile semiconductor memory 430, data can be written in all the memory cells connected with one word line by one write operation. However, the main bit line is required for every sub-bit line. Since the memory cell size is determined by the pitch of the metal wirings, this configuration of the nonvolatile semiconductor memory 430 is not suitable for miniaturization compared with the device shown in FIG. 39.

Thus, according to the present invention, a tunnel current flows only between the drain diffusion layer and the floating gate by applying a predetermined voltage to the source/drain diffusion layer (bit line). This allows the flash memory to conduct the write operation using an FN tunnel current while employing the virtual ground method. Thus, the size of the flash memory can be made smaller.

The impurity density is made different between the source diffusion layer and the drain diffusion layer constituting the source/drain diffusion layer which is shared by two adjacent memory cells. This makes it possible to flow a tunnel current only in the region of the memory cell coupled with the drain diffusion layer.

The thicker portion (the gate insulating film) and the thinner portion (the tunnel insulating film) are formed in the insulating film formed underneath the floating gate. This makes it possible to flow a tunnel current only on the drain side of the memory cell capacitively coupled via the tunnel insulating film when a predetermined voltage is applied, even though the memory cell shares the source/drain diffusion layer with an adjacent memory cell.

All the comparatively thin tunnel insulating films are formed above the source/drain diffusion layers. This makes it possible to greatly reduce the generation of an interband tunnel current in the write operation and thus improve the write efficiency and the reliability of the memory cells.

The nitride film spacers are formed as the mask defining the arrangement of the source/drain diffusion layers, and the tunnel regions are defined by use of the nitride film spacers. Thus, the tunnel regions can be made smaller. This makes it possible to increase the capacitance coupling ratio of the control gates, eliminating the necessity of a high voltage transistor module, and thus reducing processing costs.

The wiring portions of the source/drain diffusion layers, i.e., the portions of the diffusion layers other than the source coupling regions and the drain coupling regions coupled with the floating gates (tunnel regions) are covered with the comparatively thick insulating films. This makes it possible to reduce the parasitic capacitance between the control gates and the bit lines.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a nonvolatile semiconductor memory, comprising the steps of:

forming a tunnel insulating film on a semiconductor substrate of a first conductivity type;

forming a first conductive layer pattern with a patterned portion having a predetermined width by patterning a first conductive layer formed on the semi-conductor substrate;

forming a first diffusion layer in the semiconductor substrate by implanting impurities of a second conductivity type using the first conductive layer pattern as a mask;

forming a second diffusion layer in the semiconductor substrate in contact with the first diffusion layer by implanting impurities of the second conductivity type within an implantation mask different from the mask used for forming the first diffusion layer, the impurity density of the second diffusion layer being higher than that of the first diffusion layer;

forming an insulating film and a second conductive layer on the first conductive layer pattern in this order; and patterning the second conductive layer, the insulating film, and the first conductive layer, to form control gates, insulating layers, and floating gates, respectively.

2. The fabrication method according to claim 1, wherein the step of forming the second diffusion layer is performed using a second mask having a second width, and the impurities of the second conductivity type are implanted in a predetermined region of the first diffusion layer.

3. A method for fabricating a nonvolatile semiconductor memory, comprising the steps of:

forming a tunnel insulating film on a semiconductor substrate of a first conductivity type;

forming a first conductive layer with a patterned portion having a predetermined width by patterning a first conductive layer formed on the semi-conductor substrate;

forming a first diffusion layer in the semiconductor substrate by implanting impurities of a second conductivity type using the first conductive layer pattern as a mask;

forming a second diffusion layer in the semiconductor substrate in contact with the first diffusion layer by implanting impurities of the second conductive type under implantation condition different from those for forming the first diffusion layer, the impurity density of the second diffusion layer being higher than that of the first diffusion layer;

forming an insulating film and a second conductive layer on the first conductive layer pattern in this order; and patterning the second conductive layer, the insulating film, and the first conductive layer, to form control gates, insulating layers, and floating gates, respectively;

wherein the step of forming the first diffusion layer includes implanting the impurities of the second conductivity type at a predetermined angle directed to one side of an opening of the first conductive layer pattern used as the mask, and the step of forming the second diffusion layer includes implanting the impurities of the second conductivity type at a predetermined angle directed to the other side of the opening of the first conductive layer pattern used as the mask.

4. A method for fabricating a nonvolatile semiconductor memory, comprising the steps of:

forming a first insulating film on a semiconductor substrate of a first conductivity type;

forming a drain diffusion layer by implanting impurities of a second conductivity type in the semiconductor substrate using a first resist pattern having a first opening as a mask;

forming a gate insulating film using a second resist pattern having a second opening corresponding at a tunnel region as a mask and removing a portion of the first insulating film located below the second opening;

forming a tunnel insulating film in the tunnel region where the first insulating film has been removed by forming a second insulating film on the semiconductor substrate after removal of the second resist pattern;

forming a first conductive layer having a predetermined width by patterning to cover the tunnel region where the tunnel insulating film has been formed;

forming a source diffusion layer in contact with the drain diffusion layer by implanting impurities of the second conductivity type in the semiconductor substrate using the first conductive layer as a mask;

forming a third insulating film; and forming a second conductive layer on the third insulating film by patterning.

5. A method for fabricating a nonvolatile semiconductor memory, comprising the steps of:

forming a first insulating film on a semiconductor substrate of a first conductive type;

forming a drain diffusion layer by implanting impurities of a second conductivity type in the semiconductor substrate using a resist pattern having an opening corresponding to a tunnel region as a mask;

removing a portion of the first insulating film using the resist pattern as a mask;

forming a tunnel insulating film in the tunnel region where the first insulating film has been removed by forming a second insulating film on the semiconductor substrate after removal of the resist pattern;

forming a first conductive layer having a predetermined width by patterning to cover the tunnel region where the tunnel insulating film has been formed;

forming a source diffusion layer in contact with the drain diffusion layer by implanting impurities of the second conductivity type in the semiconductor substrate using the first conductive layer as a mask;

forming a third insulating film; and forming a second conductive layer on the third insulating film by patterning.

6. A method for fabricating a nonvolatile semiconductor memory, comprising the steps of:

forming a first insulating film on a semiconductor substrate of a first conductivity type;

forming a first nitride film having a first width on the first insulating film by patterning;

covering the first nitride film with an oxide film and then forming spacers on both side walls of the first nitride film, the spacer on one of the side walls corresponding to a region defining a tunnel region;

forming a diffusion layer by implanting impurities of a second conductivity type using the first nitride film and the spacers on the side walls as a mask;

removing the spacer on the other side wall of the first nitride film;

forming a second insulating film having a thickness larger than that of the first insulating film selectively using the first nitride film and the spacer as a mask;

removing the spacer on the one of the both side walls of the first nitride film and a portion of the first insulating film located below the spacer;

forming a thermal oxide film in a region where the spacer on the other side wall and the portion of the first insulating film have been removed;

removing the first nitride film;

removing the thermal oxide film;

forming a tunnel region by forming a tunnel insulating film on a region where the thermal oxide film has been removed; and forming a floating gate to cover the tunnel region.

* * * * *